(12) United States Patent
Fujiwara

(10) Patent No.: US 11,837,271 B2
(45) Date of Patent: Dec. 5, 2023

(54) MEMORY CONTROL APPARATUS AND CONTROL METHOD THEREFOR

(71) Applicant: CANON KABUSHIKI KAISHA, Tokyo (JP)

(72) Inventor: Makoto Fujiwara, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 17/683,720

(22) Filed: Mar. 1, 2022

(65) Prior Publication Data
US 2022/0270663 A1   Aug. 25, 2022

Related U.S. Application Data

(63) Continuation of application No. 17/022,166, filed on Sep. 16, 2020, now Pat. No. 11,289,148.

(30) Foreign Application Priority Data

Sep. 20, 2019   (JP) .................................. 2019-171855

(51) Int. Cl.
  *G06F 12/08*   (2016.01)
  *G11C 11/406*   (2006.01)
  *G06F 12/0875*   (2016.01)

(52) U.S. Cl.
  CPC ........ *G11C 11/406* (2013.01); *G06F 12/0875* (2013.01); *G06F 2212/1016* (2013.01)

(58) Field of Classification Search
  CPC .............. G11C 11/406; G06F 12/0875; G06F 2212/1016
  See application file for complete search history.

(56) References Cited

U.S. PATENT DOCUMENTS

| 5,838,955 A | 11/1998 | Childers |
| 2003/0076726 A1 | 4/2003 | Cowles |
| 2015/0058549 A1* | 2/2015 | Jeffrey .............. G11C 11/40622 711/106 |
| 2017/0228175 A1 | 8/2017 | Kim |

FOREIGN PATENT DOCUMENTS

| JP | H103785 A | 1/1998 |
| JP | 2002050176 A | 2/2002 |

OTHER PUBLICATIONS

Notice of Allowance issued in U.S. Appl. No. 17/022,166 dated Nov. 24, 2021.

* cited by examiner

*Primary Examiner* — Jae U Yu
(74) *Attorney, Agent, or Firm* — ROSSI, KIMMS & McDOWELL LLP

(57) ABSTRACT

A memory control apparatus controls access to a DRAM having a plurality of banks. The apparatus comprises a first generating unit configured to generate an access command in accordance with an access request for the DRAM and store the access command in a buffer; a second generating unit configured to generate a bank-designated refresh request for the DRAM; and an issuing unit configured to issue a DRAM command to the DRAM based on an access command stored in the buffer and a refresh request generated by the second generating unit. The second generating unit determines a bank for which the refresh request is generated, based on an access time for each bank of the DRAM by not less than one access command stored in the buffer.

10 Claims, 21 Drawing Sheets

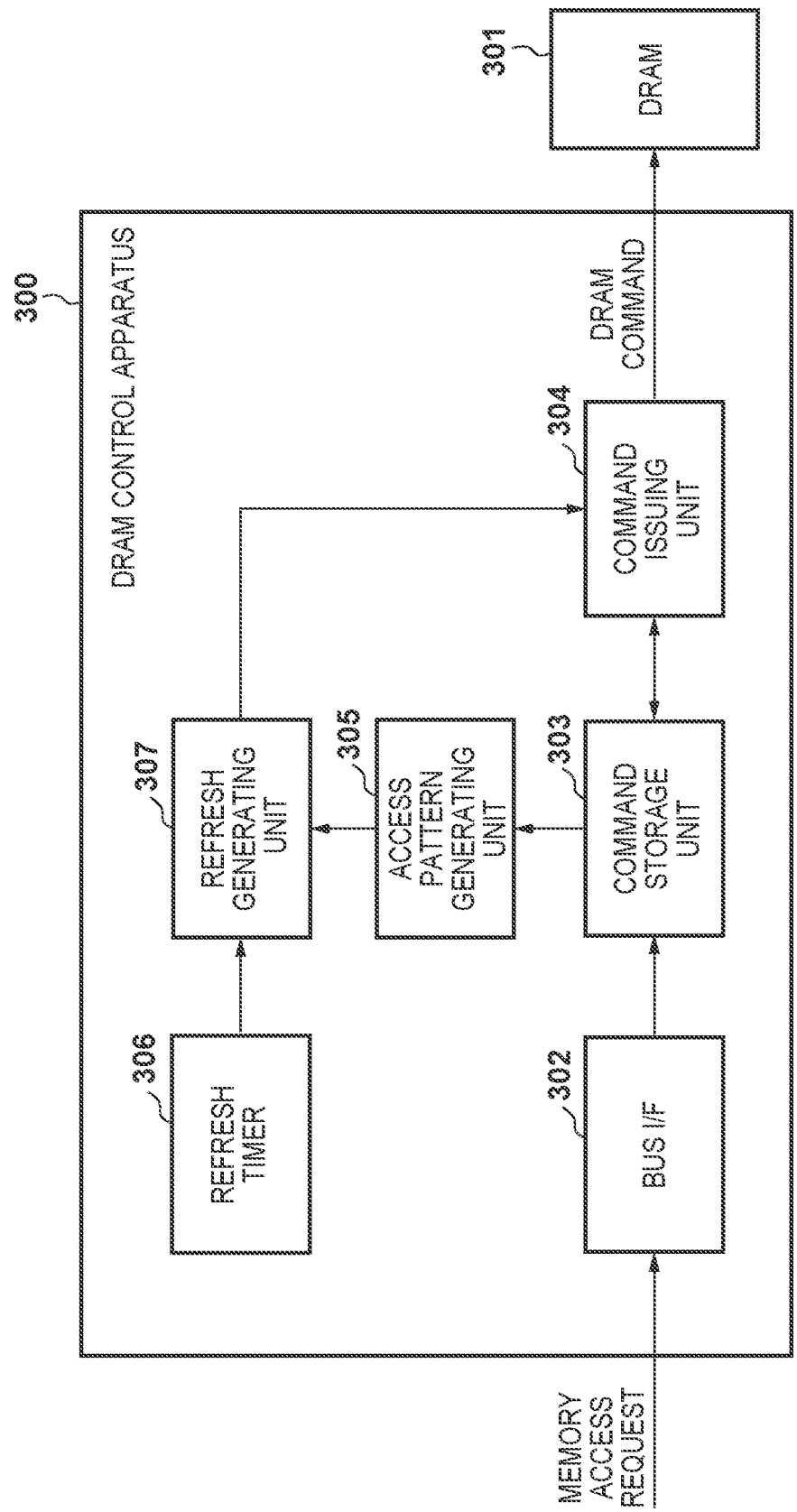

| | | | | | |
|---|---|---|---|---|---|
| 401 | COMMAND | READ | WRITE | WRITE | WRITE |
| 402 | BANK | 0 | 3 | 2 | 1 |
| 403 | ROW ADDRESS | R0 | R1 | R2 | R1 |
| 404 | COLUMN ADDRESS | C0 | C1 | C2 | C1 |
| 405 | TRANSFER LENGTH | 16 | 64 | 16 | 128 |
| 406 | TRANSFER ID | ID0 | ID1 | ID2 | ID3 |

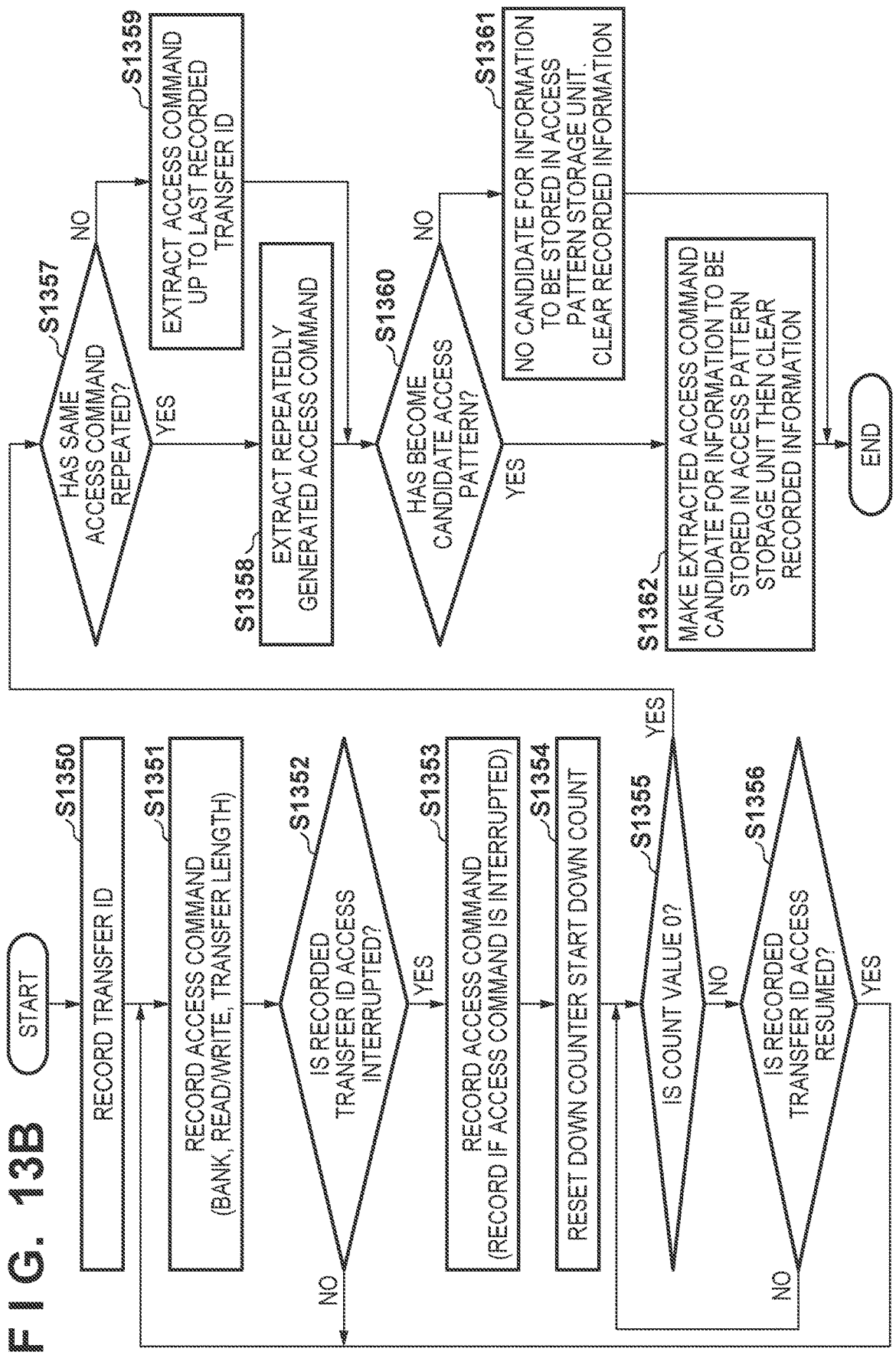

FIG. 14A

| TRANSFER ID | ACCESS COMMAND | DOWN COUNTER |
|---|---|---|
| ID0 | BANK0/READ/64→OTHER ID ACCESS→BANK1/WRITE/32→ACCESS IS INTERRUPTED →BANK2/WRITE/64→BANK3/WRITE/64→ACCESS IS INTERRUPTED | 0 |

↓ ACCESS PATTERN CANDIDATE

| ID0 | BANK0/READ/64→OTHER ID ACCESS→BANK1/WRITE/32→ACCESS IS INTERRUPTED →BANK2/WRITE/64→BANK3/WRITE/64 |
|---|---|

FIG. 14B

| TRANSFER ID | ACCESS COMMAND | DOWN COUNTER |
|---|---|---|
| ID3 | BANK0/READ/32→BANK1/READ/32→ACCESS IS INTERRUPTED →BANK0/READ/32→BANK1/READ/32→ACCESS IS INTERRUPTED →BANK0/READ/32→BANK1/READ/32→ACCESS IS INTERRUPTED | 0 |

↓ ACCESS PATTERN CANDIDATE

| ID3 | BANK0/READ/32→BANK1/READ/32 |
|---|---|

FIG. 16

| TRANSFER ID | ACCESS PATTERN MATCH FLAG | ACCESS PATTERN | | | | |
|---|---|---|---|---|---|---|
| | | TRANSFER 0/ TRANSFER TIME | TRANSFER 1/ TRANSFER TIME | TRANSFER 2/ TRANSFER TIME | TRANSFER 3/ TRANSFER TIME | TRANSFER 4/ TRANSFER TIME |
| ID0 | 1 | BANK 0/ XX nsec | BANK 1/ YY nsec | ACCESS IS INTERRUPTED | BANK 0/ ZZ nsec | BANK 1/ AA nsec |
| ID3 | 0 | BANK 3/ BB NSEC | — | — | — | — |
| — | — | — | — | — | — | — |

1600 1602 1601

| BANK | TOTAL NUMBER OF READ COMMANDS/ WRITE COMMANDS | TOTAL NUMBER OF OTHER BANK READ COMMANDS/ WRITE COMMANDS | REFRESH PRIORITY LEVEL |
|---|---|---|---|
| 0 | 0 | 54 | 4 |
| 1 | 10 | 49 | |
| 2 | 0 | 59 | 1 |
| 3 | 7 | 52 | 5 |
| 4 | 12 | 47 | |
| 5 | 2 | 57 | 2 |
| 6 | 3 | 56 | 3 |
| 7 | 20 | 39 | |

NUMBER OF READ COMMAND/WRITE COMMAND THAT CAN BE ISSUED IN PARALLEL WITH REFRESH = 50

MEMORY CONTROL APPARATUS AND CONTROL METHOD THEREFOR

BACKGROUND OF THE INVENTION

Field of the Invention

The present invention relates to access control for a memory and, more particularly, to control pertaining to the refresh of a DRAM.

Description of the Related Art

DRAMs (Dynamic Random Access Memories) are widely used as the main memory devices of computer systems. With increases in speed and function of computer systems, there are increasing demands for higher DRAM access performance. Accordingly, faster DRAMs have been developed. A DRAM is a memory device that requires refresh (memory holding operation) to continuously hold data. DRAMs complying with the DDR2 specification and the previous specifications periodically refresh all the banks at the same time. Besides, memory access during refresh is inhibited. This leads to a deterioration in memory access performance.

In order to suppress a deterioration in memory access performance caused by refresh, the LPDDR2 specification has added a function for refreshing a DRAM on a bank-by-bank basis. The LPDDR4 specification has added a function for designating a refresh bank in bank-by-bank basis refresh. Japanese Patent Laid-Open No. 2002-50176 (patent literature 1) discloses a method of refreshing banks to which no memory access is made while performing memory access in a memory controller that controls a memory constituted by a plurality of memory areas.

A DRAM, however, requires a longer refresh execution time than the shortest time required for memory access. For this reason, even if the start timing of memory access is synchronized with the start timing of refresh as in the method disclosed in patent literature 1, refresh may not end at the timing when memory access ends. As a consequence, if a bank that is not completely refreshed is the same bank that is subjected to next memory access, the memory access is waited, thus leading to a deterioration in memory access performance.

SUMMARY OF THE INVENTION

According to one aspect of the present invention, a memory control apparatus that controls access to a DRAM having a plurality of banks, the apparatus comprises: a first generating unit configured to generate an access command in accordance with an access request for the DRAM and store the access command in a buffer; a second generating unit configured to generate a bank-designated refresh request for the DRAM; and an issuing unit configured to issue a DRAM command to the DRAM based on an access command stored in the buffer and a refresh request generated by the second generating unit, wherein the second generating unit determines a bank for which the refresh request is generated, based on an access time for each bank of the DRAM by not less than one access command stored in the buffer.

The present invention enables more efficient memory access.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a block diagram showing the arrangement of a DRAM control apparatus according to the first embodiment;

FIGS. 13A and 13B are flowcharts for processing executed by an access pattern candidate generating unit;

FIGS. 14A and 14B are views for explaining the relationship between access commands and access pattern candidates;

FIG. 16 is a view for explaining information recorded in an access pattern buffer;

DESCRIPTION OF THE EMBODIMENTS

Figure 1:
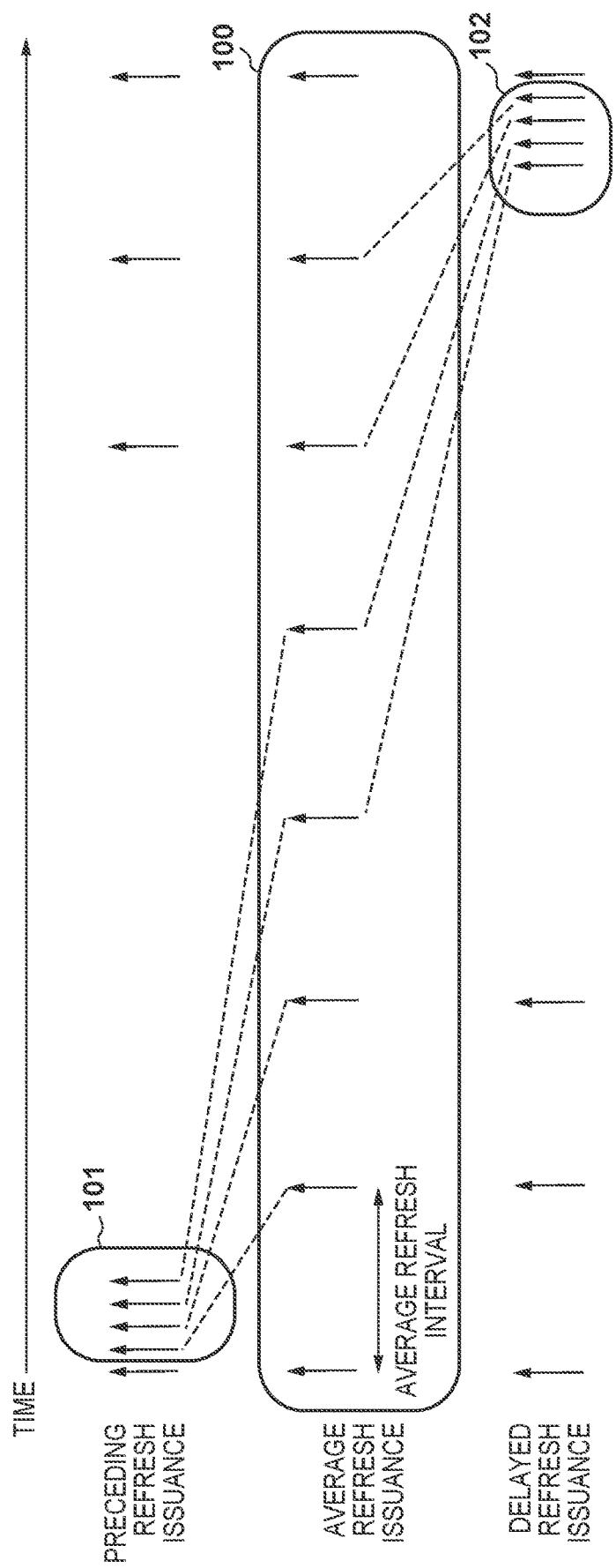
FIG. 1 is a view for explaining refresh command issuance in a DRAM.

Hereinafter, embodiments will be described in detail with reference to the attached drawings. Note, the following embodiments are not intended to limit the scope of the claimed invention. Multiple features are described in the embodiments, but limitation is not made an invention that requires all such features, and multiple such features may be combined as appropriate. Furthermore, in the attached drawings, the same reference numerals are given to the same or similar configurations, and redundant description thereof is omitted.

First Embodiment

A DRAM control apparatus that controls DRAM access complying with the LPDDR4 specification will be exemplified as the first embodiment of a memory control apparatus according to the present invention.

<DRAM Refresh>

A refresh operation required for a DRAM to continuously hold data will be described first. FIG. 1 is a view for explaining refresh command issuance in the DRAM.

The DRAM can hold data by performing refresh once at the average refresh interval determined by the specification like average refresh issuance 100. DRAM refresh and memory access use common command signals. There are many timing restrictions on the issuance of commands other than refresh commands, and hence it is difficult to always perform refresh at an average refresh interval.

The DRAM allows the issuance of refresh commands before the average refresh issuance timings as indicated by preceding refresh issuance 101. The DRAM also allows the delayed issuance of refresh commands with respect to the average refresh issuance timings as indicated by delayed refresh issuance 102. The specification determines in advance the number of refresh commands that can be issued at preceding timings and the number of refresh commands that can be issued at delayed timings. The DRAM control apparatus can change refresh command issuance timings within this allowable range.

Figure 2A:
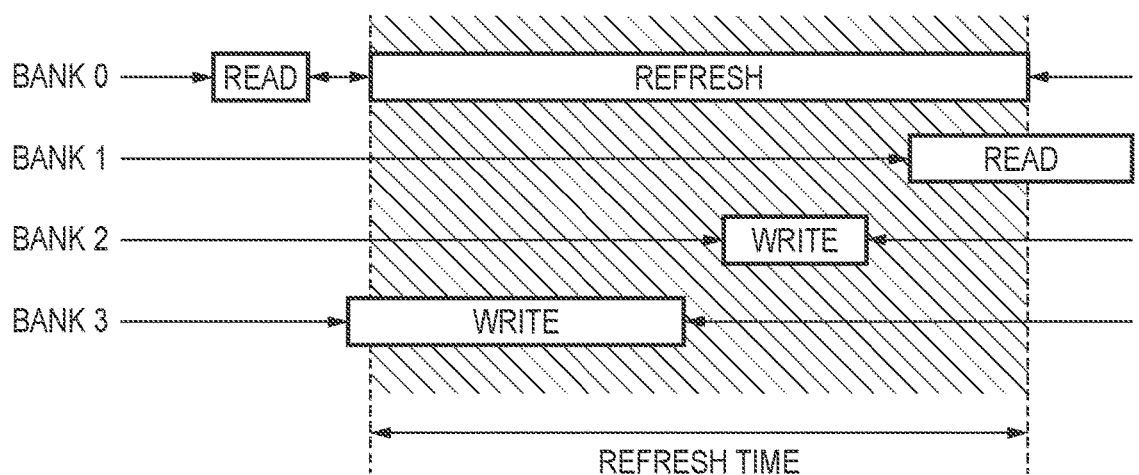
FIGS. 2A and 2B are timing charts for explaining bank-designated refresh.
Figure 2B:
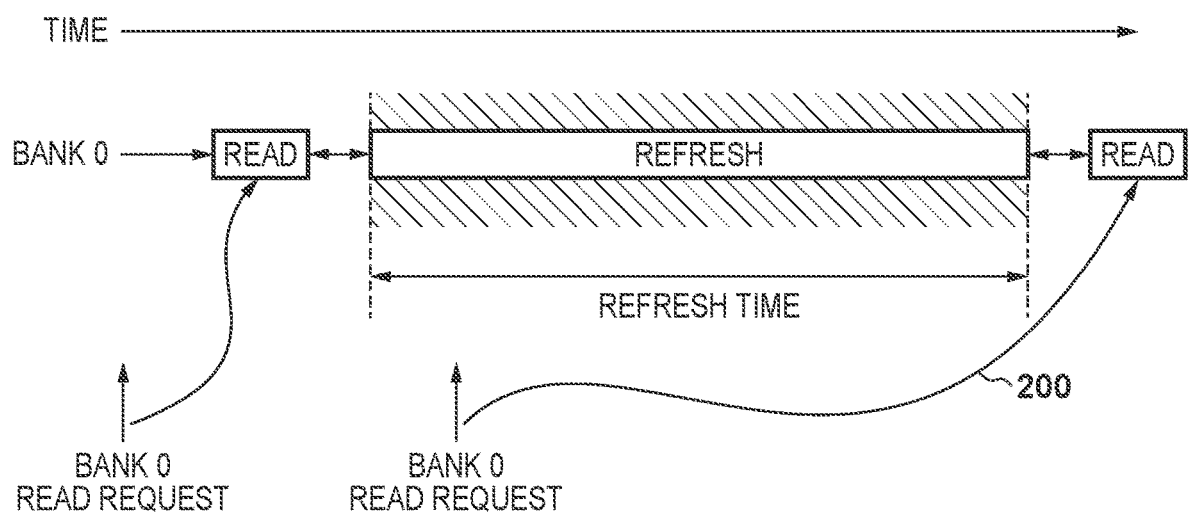

FIGS. 2A and 2B are timing charts for explaining bank-designated refresh. FIG. 2A shows refresh for designated bank 0. Bank-designated refresh allows memory access including read and write operations for the remaining banks during refresh for the designated bank. In contrast to this, as shown in FIG. 2B, memory access to the bank during refresh is inhibited. For this reason, when a memory access request is generated for a refresh bank, memory access is performed after the completion of the refresh (arrow 200). As described above, bank-designated refresh allows, during refresh of a given bank, memory access to other banks. However, in order to use a memory band more efficiently, it is necessary to perform refresh control so as to prevent refresh and memory access to the same bank.

<Apparatus Arrangement>

FIG. 3 is a block diagram showing the arrangement of a DRAM control apparatus according to the first embodiment. A DRAM control apparatus 300 issues a DRAM command to a DRAM 301 in accordance with the memory access request issued by an initiator (not shown).

A bus interface (I/F) 302 receives the memory access request issued by the initiator, converts the request into an access command for each row address which designates an area called a page of the DRAM 301, and transmits the command to a command storage unit 303.

The command storage unit 303 has a buffer that holds a plurality of access commands generated by the bus I/F 302. When the access command is stored in the buffer, the command storage unit 303 notifies a command issuing unit 304 of the completion of preparation for command transmission, and transmits the access command to the command issuing unit 304 in accordance with a response from the command issuing unit 304. In order to improve the efficiency of DRAM access or implement a memory access request in accordance with the urgency, the arrangement may be configured to interchange the order of memory access requests received. In addition, the order of memory access requests may be interchanged by changing the storage order of access commands in the buffer.

An access pattern generating unit 305 monitors an access command stored in the command storage unit 303, predicts the memory access performed by the DRAM control apparatus 300 to the DRAM 301, and generates an access pattern. The access pattern will be described later with reference to FIG. 5.

A refresh timer 306 is a timer that counts the lapse of an average refresh period, and notifies a refresh generating unit 307 of the lapse of the average refresh period.

The refresh generating unit 307 generates a bank-designated refresh request in accordance with the average refresh period information notified by the refresh timer 306 and the access pattern generated by the access pattern generating unit 305, and notifies the command issuing unit 304 of the request.

The command issuing unit 304 generates a DRAM access command for accessing the DRAM 301 from the access command for each row address received from the command storage unit 303. The command issuing unit 304 also generates a refresh command for refreshing the DRAM 301 in accordance with the refresh request for each bank generated by the refresh generating unit 307. The command issuing unit 304 issues a DRAM command to the DRAM 301 upon adjusting the issuance timings of the DRAM access command and the refresh command.

Figures 4, 5:
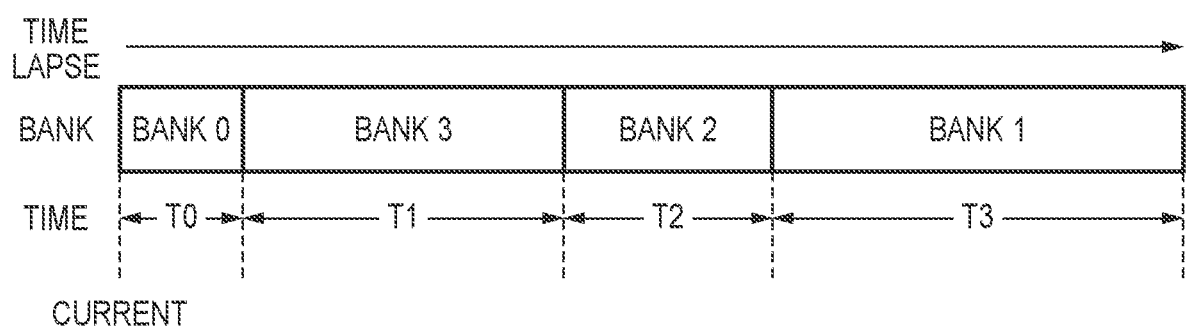
FIG. 4 is a view showing an example of an access command for each row address.
FIG. 5 is a timing chart showing an example of an access pattern.

FIG. 4 shows an example of an access command for each row address stored in the command storage unit. The access command includes a command 401, a bank 402, a row address 403, a column address 404, a transfer length 405, and a transfer ID 406. The command 401 indicates whether the access command is a read or write command. The transfer ID 406 is information to be added by the initiator at the time of issuing a memory access request. In addition, the row address 403 and the column address 404 will be collectively referred to as address information hereinafter. The command storage unit stores a plurality of access commands on a row address basis. This makes it possible to predict memory access by analyzing information stored in the command storage unit.

FIG. 5 shows an example of the access pattern generated by the access pattern generating unit. The access pattern generating unit predicts the access time for each bank from the command, address information, and transfer length of each access command stored in the command storage unit. An access pattern indicates the access order of banks to be accessed and the access times in which the respective banks are accessed. The access pattern shown in FIG. 5 indicates that bank 0, bank 3, bank 2, and bank 1 are respectively accessed at time T0, time T1, time T2, and time T3 in this order. The access times vary depending on the current state of the DRAM and can be predicted with higher accuracy by additionally considering the states of the respective banks in the DRAM.

<Operation of Apparatus>

FIGS. 6A to 6E are views for explaining a method of extracting refresh candidates according to the first embodiment. Each drawing shows a method of extracting refresh candidates from a generated access pattern in the DRAM having an eight-bank configuration (bank 0 to bank 7). Referring to FIGS. 6A to 6E, the numbers indicated in each access pattern indicate banks to be accessed. Each width indicated on each access pattern indicates the time interval in which access is made. For example, the access pattern in FIG. 6A indicates that bank 0, bank 2, bank 1, . . . , bank 7 are accessed in the same access time interval in this order, and then bank 0 is accessed in a long time interval.

Figure 6A:
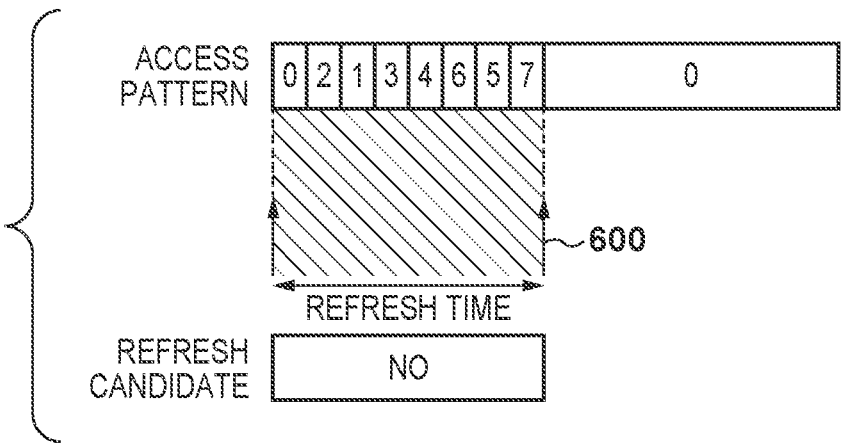
FIGS. 6A to 6E are timing charts for explaining a method of extracting refresh candidates according to the first embodiment.

When refresh commands are issued at the timing indicated by the hatched lines in the access pattern shown in FIG. 6A, memory access overlaps refresh times at all the banks from bank 0 to bank 7. Accordingly, the start timing of transfer of the bank to which a refresh command is issued at this timing needs to be delayed up to time 600 at which refresh is completed, thus leading to a deterioration in memory access performance. Therefore, in the state in FIG. 6A, refresh candidate is "none".

Figure 6B:
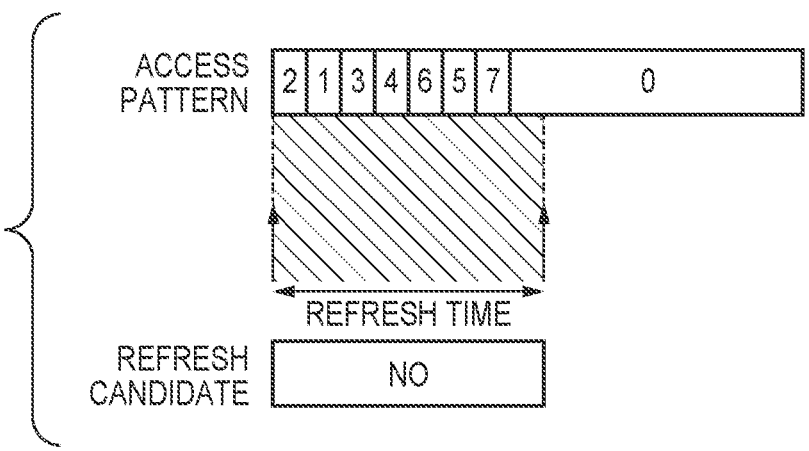

FIG. 6B shows a state after the lapse of time from the time in FIG. 6A to the instant the transfer of bank 0 at the head position is completed. As in FIG. 6A, in the state in FIG. 6B, because memory access overlaps refresh times at all the banks, refresh candidate is set to "none".

Figure 6C:
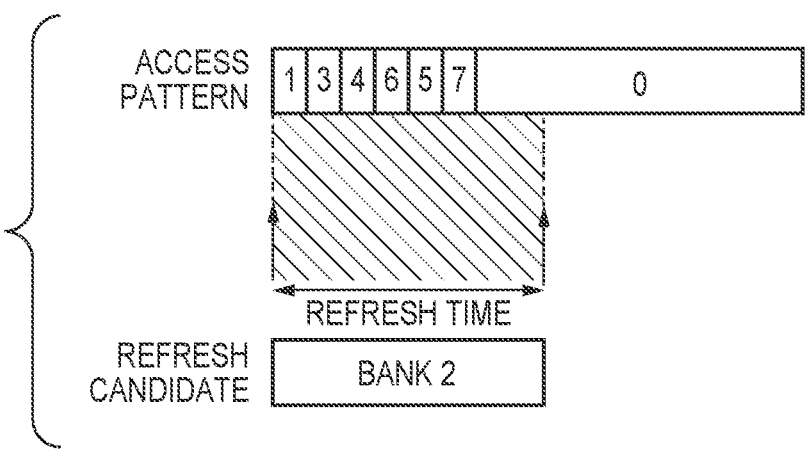

FIG. 6C shows a state after the lapse of time from the time in FIG. 6B to the instant the transfer of bank 2 at the head position is completed. No transfer of bank 2 occurs at the timing indicated by the hatched lines in FIG. 6C, and hence the issuance of a refresh command to bank 2 within the refresh time has no influence on the memory access performance. Therefore, in the state in FIG. 6C, refresh candidate is set to "bank 2".

Figure 6D:
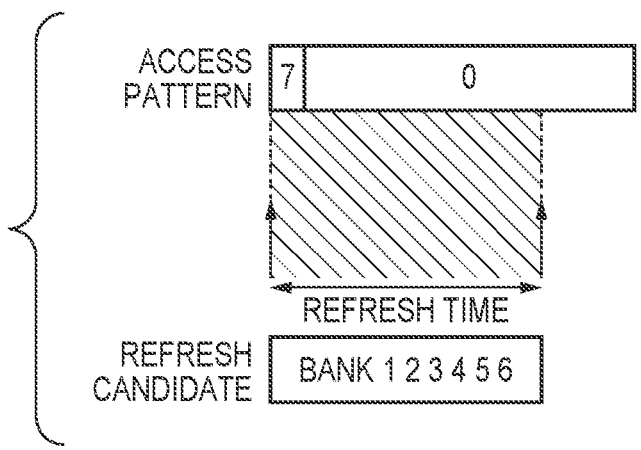

FIG. 6D shows a state in which there are a plurality of refresh candidates. Referring to FIG. 6D, memory access occurs to only the two banks, namely, bank 7 and bank 0, within the refresh time, and hence the six banks, namely, "bank 1" to "bank 6", are all refresh candidates.

Figure 6E:
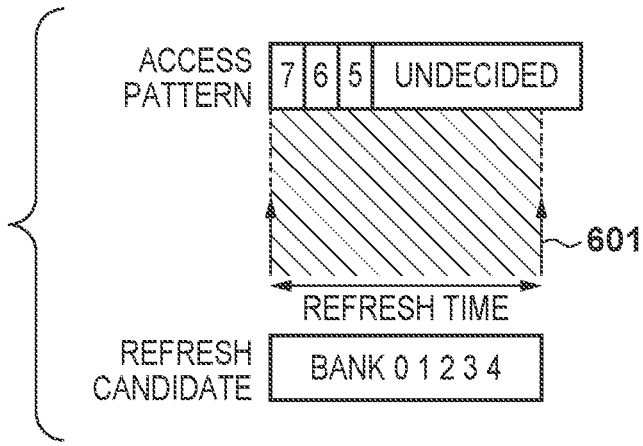

FIG. 6E shows a state in which no access pattern within the refresh time is determined. FIG. 6E indicates that access occurs to bank 7, bank 6, and bank 5 in the first half of the refresh period. On the other hand, no memory access is determined after the transfer of bank 5. If no memory access occurs in a period until the end of refresh after the transfer of bank 5, the issuance of a refresh command to a bank other than banks 5, 6, and 7 has no influence on the transfer performance. If, however, a memory access request for the same bank to which a refresh command has issued before time 601 when refresh is completed is received, DRAM access is waited until time 601 when refresh is completed. Accordingly, the refresh candidates in FIG. 6E are five banks, namely, "bank 0" to "bank 4", to which no access occurs within the refresh time. However, because any memory access within the refresh time is not determined, it is possible that the access pattern will be updated upon reception of memory access requests for bank 0 to bank 4 after the issuance of a refresh command. Accordingly, in such a case, whether to issue a refresh command is switched depending on whether the issuance state of a refresh command is a preceding refresh state or delayed refresh state.

Figure 7:
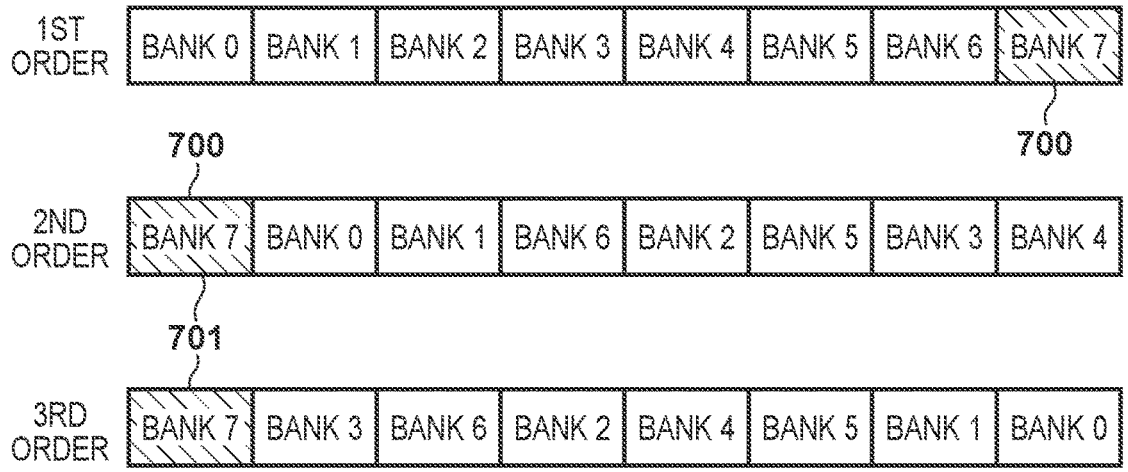
FIG. 7 is a chart for explaining restrictions on bank-designated refresh.

FIG. 7 is a view for explaining restrictions on bank-designated refresh in LPDDR4. Although LPDDR4 enables bank-designated refresh, there are restrictions on the designation order of banks. Although LPDDR4 allows designation of banks to be refreshed, the respective banks need to be uniformly refreshed. For this reason, there is a restriction that, unless all the banks are refreshed once, the second refresh command cannot be issued to each bank. Consider a given bank in a DRAM having an eight-bank configuration. The same bank can be refreshed twice consecutively (timing 700) at earliest. When the same bank is refreshed twice consecutively in this manner, the bank is refreshed next at the eighth timing of refresh (timing 701) at earliest.

Figure 8:
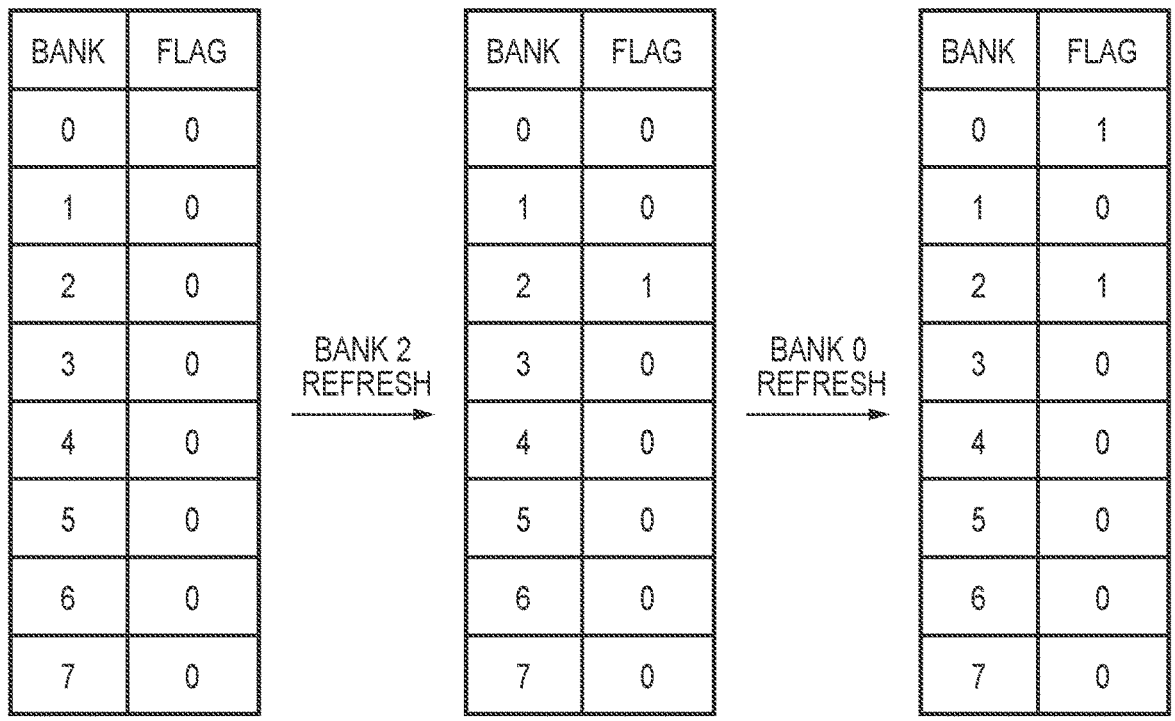
FIG. 8 is a chart showing an example of a refresh management table.

FIG. 8 shows an example of a refresh management table. The refresh management table is used to satisfy the restriction on bank-designated refresh in LPDDR4 as described above. As shown in FIG. 8, when a refresh command is issued to a given bank, the flag of the bank is set (flag=1), and a next refresh bank is selected from the banks whose flags are not set (flag=0). Note that if refresh commands are issued to all the banks, and the flags of all the banks are set (flag=1), the flags of all the banks are reset to set a state in which refresh commands can be issued to all the banks.

Figure 9:
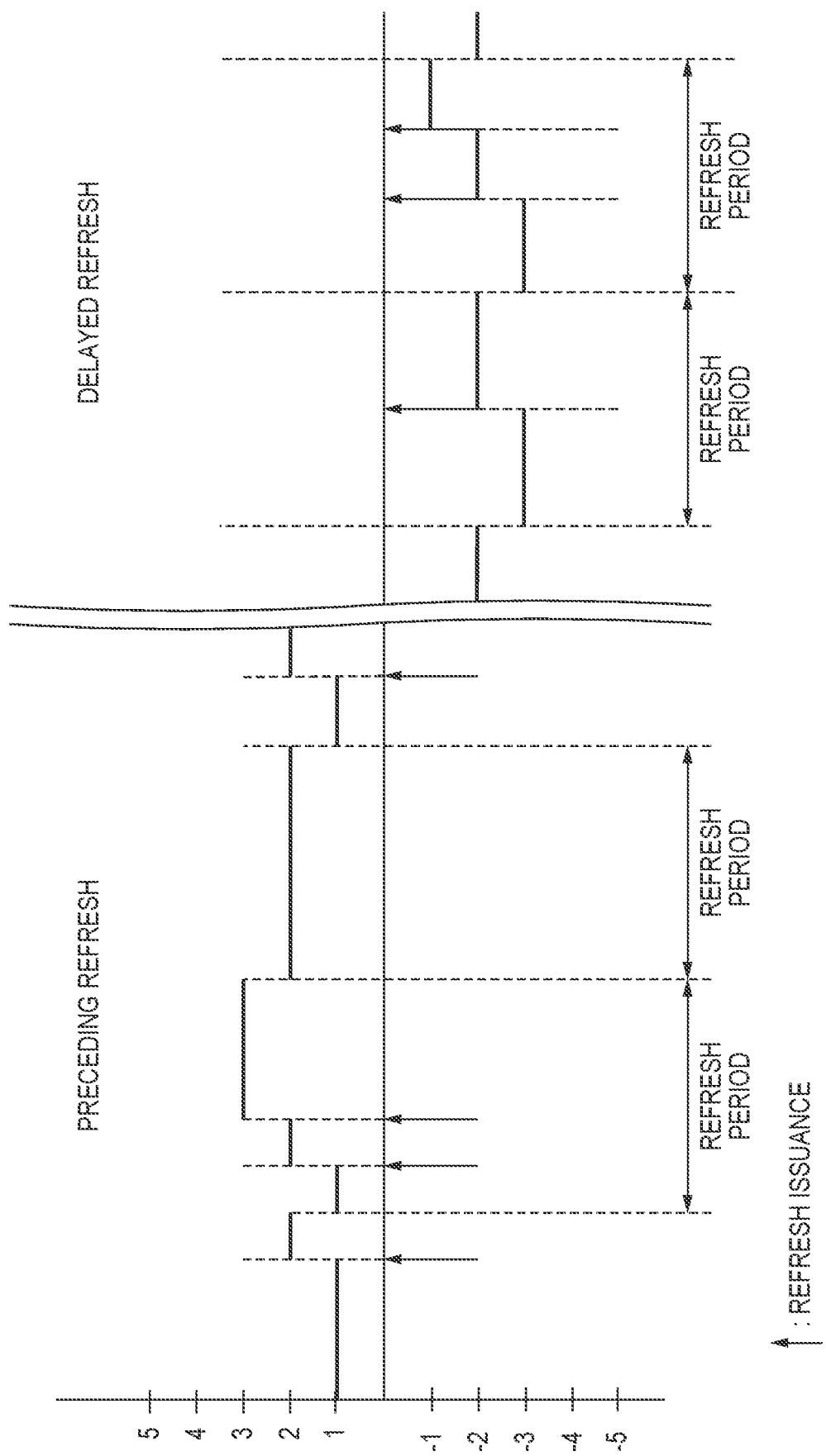
FIG. 9 is a timing chart for explaining a refresh state counter.

FIG. 9 is a view for explaining a refresh state counter of a refresh generating unit. The refresh state counter is a counter for detecting whether the refresh issuance state with respect to the DRAM is the preceding refresh state or the delayed refresh state. As shown in FIG. 9, the refresh state counter is configured to count up when a refresh command is issued to the DRAM and to count down when a refresh period has elapsed. That is, when the counter value indicates a positive value, the preceding refresh state is set, whereas when the counter value indicates a negative value, the delayed refresh state is set.

Figure 10:
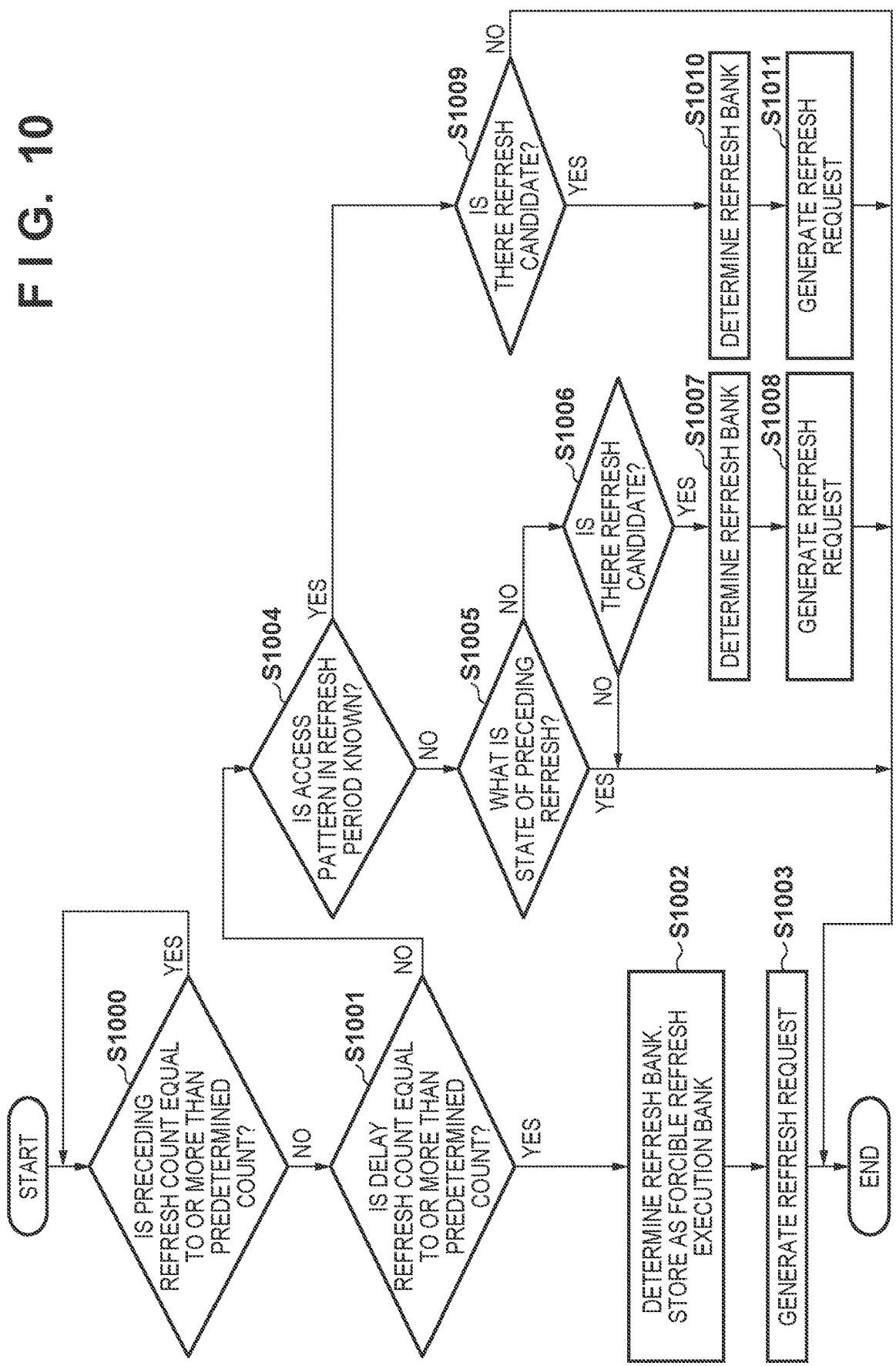
FIG. 10 is a flowchart for refresh request generation.

FIG. 10 is a flowchart for refresh request generation executed by the refresh generating unit. This flowchart starts when refresh is not currently executed.

In step S1000, the refresh generating unit determines whether the preceding refresh count is equal to or more than a predetermined count. If the preceding refresh count is equal to or more than the predetermined count, this determination is repeated. If the preceding refresh count is less than the predetermined count, the process advances to step S1001. This is because the preceding refresh count is specified by the DRAM specification, and hence it is necessary to stop refresh if the preceding refresh count is equal to or more than the predetermined count. Note that, as described above, the refresh generating unit recognizes from the refresh state counter that the current refresh issuance state is the preceding refresh state or delayed refresh state.

In step S1001, the refresh generating unit determines whether the delayed refresh count is equal to or more than a predetermined count. If the delayed refresh count is equal to or more than the predetermined count, the process advances to step S1002. If the delayed refresh count is less than the predetermined count, the process advances to step S1004. This is because the delayed refresh count is also specified by the DRAM specification.

In step S1002, the refresh generating unit determines a refresh bank and stores the determined bank as a forcible refresh execution bank. When determining a refresh bank, the refresh generating unit checks the refresh management table described with reference to FIG. 8 to select one of banks whose flags are not set (flag=0). In step S1003, the refresh generating unit generates a refresh request for the determined bank.

If the delayed refresh count is less than the predetermined count (NO in step S1001), there is no need to hasten refresh command issuance, and it is allowed to issue a refresh command within the range of timings with no influence on memory access.

In step S1004, the refresh generating unit checks an access pattern like that described with reference to FIGS. 6A to 6E to determine whether the access pattern within a refresh period is known. If the access pattern within the refresh period is not known, the process advances to step S1005; otherwise, the process advances to step S1009.

In step S1005, the refresh generating unit checks whether the current refresh state is a preceding refresh state. This is because it is necessary to give a consideration to a case in which a memory access request for a bank is received during refresh after the issuance of a refresh command. If the current refresh state is a preceding refresh state, the refresh generating unit generates no refresh request. If the current refresh state is a delayed refresh state, the process advances to step S1006.

In step S1006, the refresh generating unit checks whether there is a refresh candidate like that described with reference to FIGS. 6A to 6E. If there is a refresh candidate, the process advances to step S1007; otherwise (flag=0 indicating that there is no bank), the refresh generating unit generates no refresh request.

In step S1007, the refresh generating unit determines a refresh bank. In step S1008, the refresh generating unit generates a refresh request for the determined bank. The refresh candidate in this case needs to be a bank whose flag is not set (flag=0), which is confirmed by checking the refresh management table described with reference to FIG. 8. Here, if determining a refresh bank from a plurality of refresh candidates, the refresh generating unit may preferentially determine a bank to which the unit issued a forcible refresh command in the past. This is because preferentially refreshing the bank to which the refresh generating unit issued a forcible refresh command in the past will prevent issuing a forcible refresh command to the same bank again and suppress refresh from influencing memory access to a specific bank.

If an access pattern within the refresh period is known (YES in step S1004), there is no need to change the processing depending on whether the current refresh is preceding refresh or delayed refresh.

In step S1009, the refresh generating unit checks whether there is a refresh candidate. If there is a refresh candidate, the process advances to step S1010. If there is no refresh candidate (flag=0 indicating that there is no bank), the refresh generating unit generates no refresh request.

In step S1010, the refresh generating unit determines a refresh bank. In step S1011, the refresh generating unit generates a refresh request for the bank determined by the refresh generating unit. A refresh candidate in this case also needs to be a bank whose flag is not set (flag=0), which is confirmed by checking the refresh management table described with reference to FIG. 8. As well, if determining a refresh bank from a plurality of refresh candidates, the refresh generating unit may preferentially determine a bank to which a forcible refresh command has been issued in the delayed refresh state.

As has been described above, according to the first embodiment, a bank as a refresh candidate is determined so as to prevent a bank subjected to memory access from overlapping a refresh bank, and bank-designated refresh is performed. This arrangement enables more efficient memory access and can suppress a deterioration in memory access performance caused by refresh.

Second Embodiment

The second embodiment will exemplify another method of determining refresh candidates. More specifically, this embodiment will exemplify an embodiment of determining a refresh candidate in each time interval based on an access pattern and determining a bank to be preferentially refreshed.

<Apparatus Arrangement>

Figure 11:
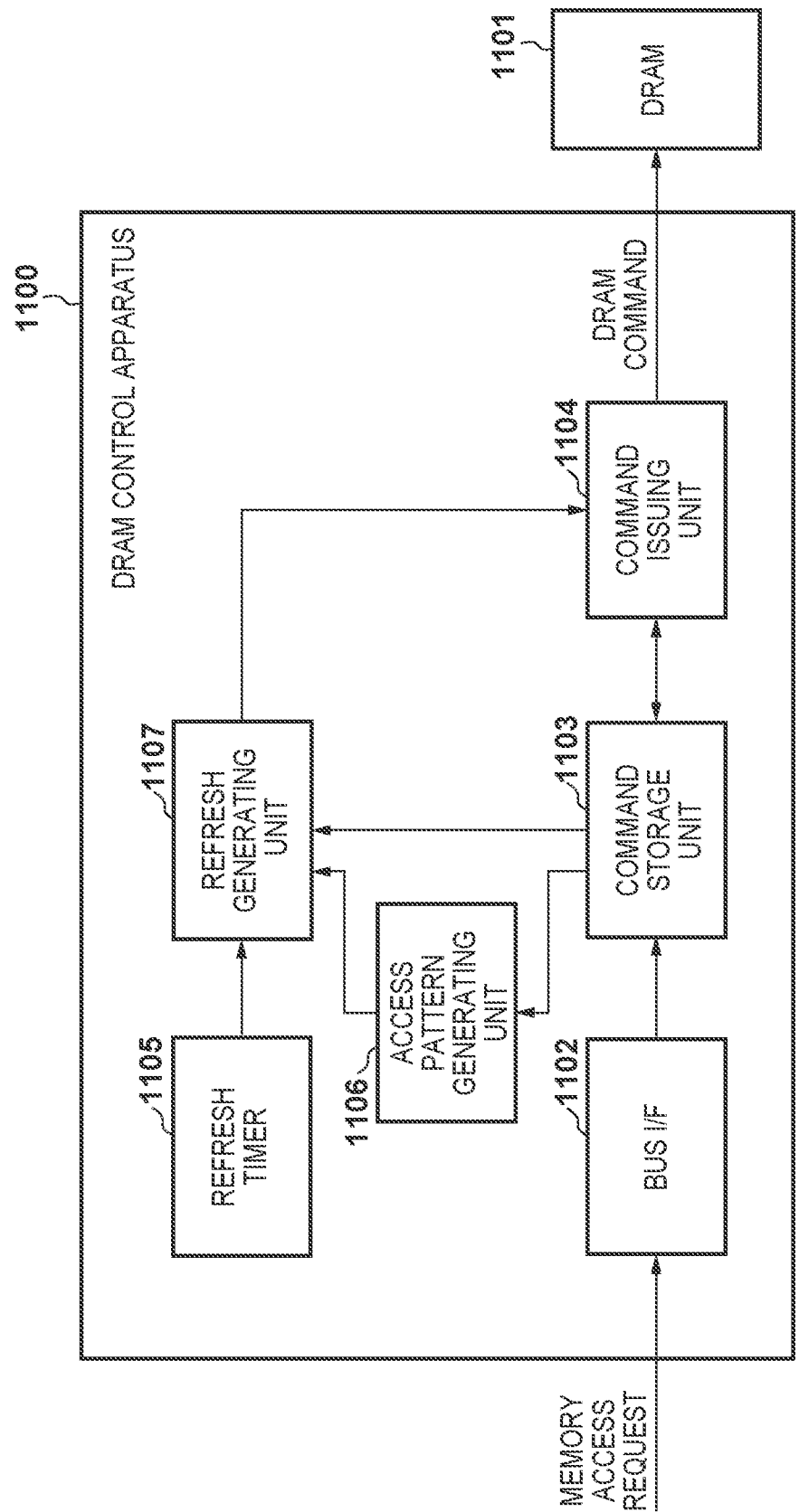
FIG. 11 is a block diagram showing the arrangement of a DRAM control apparatus according to the second embodiment.

FIG. 11 shows the arrangement of a DRAM control apparatus 1100 according to the second embodiment. The DRAM control apparatus 1100 is similar to the DRAM control apparatus according to the first embodiment (FIG. 3), but mainly differs from it in that the DRAM control apparatus 1100 includes an access pattern storage unit 1106 instead of the access pattern generating unit 305, and a refresh generating unit 1107 acquires information from a command storage unit 1103.

The access pattern storage unit 1106 monitors the access commands stored in the command storage unit 1103 and extracts and stores an access pattern that is repeatedly generated.

The refresh generating unit 1107 generates a refresh request. More specifically, the refresh generating unit 1107 compares the average refresh period notified by a refresh timer 1105, the access pattern stored in the access pattern storage unit 1106, and the access commands stored in the command storage unit 1103, and generates a refresh request.

That is, in the second embodiment, the refresh generating unit 1107 determines a refresh candidate by further using the access pattern stored in the access pattern storage unit 1106.

Figure 12:
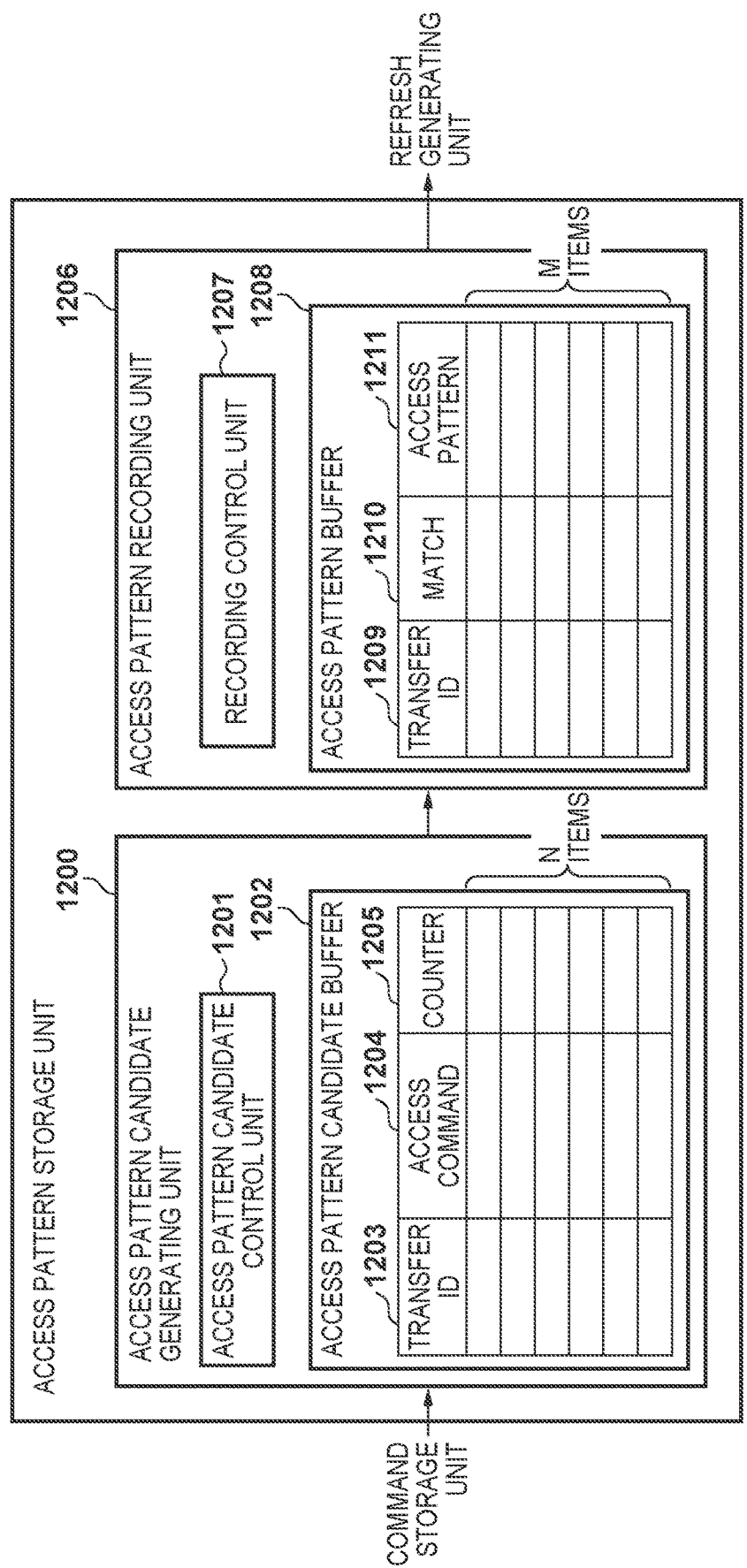
FIG. 12 is a view for explaining the arrangement of an access pattern storage unit.

FIG. 12 is a view for explaining the arrangement of the access pattern storage unit 1106. The access pattern storage unit 1106 includes an access pattern candidate generating unit 1200 and an access pattern recording unit 1206. The access pattern candidate generating unit 1200 monitors the command storage unit to generate an access pattern candidate. The access pattern recording unit 1206 receives the access pattern candidate generated by the access pattern candidate generating unit 1200 and records an access pattern.

The access pattern candidate generating unit 1200 is constituted by an access pattern candidate control unit 1201 and an access pattern candidate buffer 1202. The access pattern candidate buffer 1202 has N recording areas. Each recording area stores a transfer ID 1203, an access command 1204, and a counter 1205. The counter 1205 is a down counter that measures the time since the interruption of transfer of the recorded transfer ID.

The access pattern recording unit 1206 is constituted by a recording control unit 1207 and an access pattern buffer 1208. The access pattern buffer 1208 has M recording areas. Each recording area stores a transfer ID 1209, an access pattern match flag 1210, and an access pattern 1211.

<Operation of Apparatus>

Figure 13A:
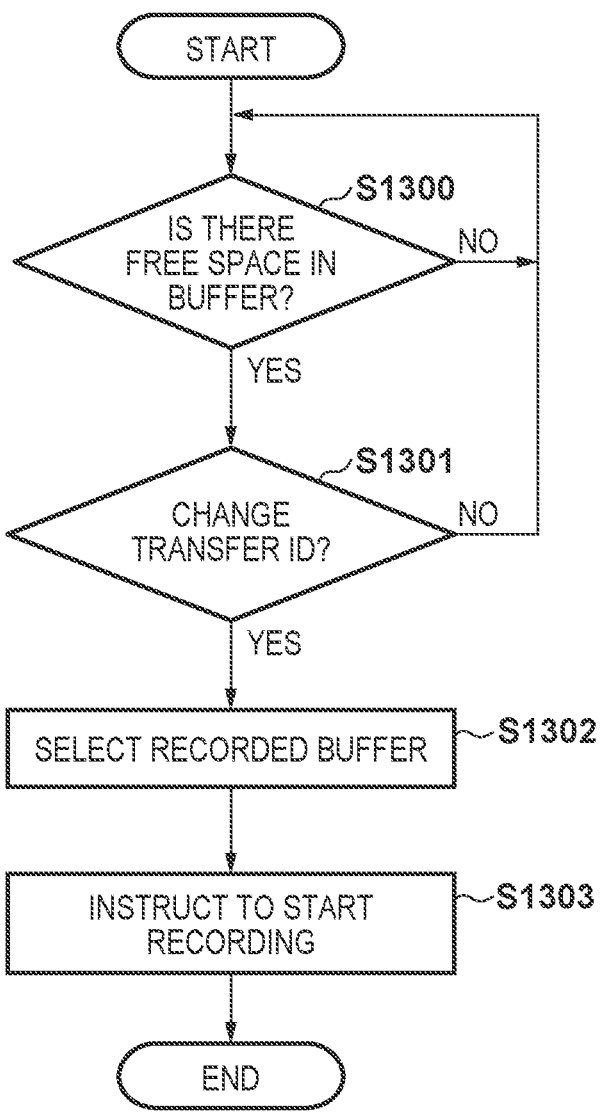

FIGS. 13A and 13B are flowcharts for processing executed by the access pattern candidate generating unit 1200. FIG. 13A shows a procedure for determining an access pattern candidate buffer for storing access pattern candidates. FIG. 13B is a flowchart for explaining the operation of recording on the recording area of the access pattern candidate buffer 1202 instructed to start recording.

In step S1300, the access pattern candidate control unit 1201 checks first whether there is any free space in the buffer. If there is no free space in the buffer, the access pattern candidate control unit 1201 repeatedly checks and stands by until a free space is available in the buffer. If a free space is available in the buffer, the process advances to step S1301. In step S1301, the access pattern candidate control unit 1201 determines whether the transfer ID has changed. If the transfer ID has not changed, the access pattern candidate control unit 1201 repeatedly executes determination and stands by until the transfer ID changes. If the transfer ID has changed, the process advances to step S1302. In step S1302, the access pattern candidate control unit 1201 selects a buffer to record an access command. In step S1303, the access pattern candidate control unit 1201 issues an instruction to start recording on the selected recording area.

In step S1350, upon receiving the instruction to start recording access commands, the access pattern candidate buffer 1202 records the transfer ID of the access command generated first. In step S1351, the access pattern candidate buffer 1202 sequentially records generated access commands. The access pattern candidate buffer 1202 keeps recording access commands unless access corresponding to the transfer ID is interrupted. Here, the access pattern candidate buffer 1202 records a bank to be accessed, information indicating a read or write access, and the transfer length of data to be transferred. In step S1352, the access pattern candidate buffer 1202 determines whether access corresponding to the recorded transfer ID is interrupted. If the access is interrupted, the process advances to step S1353. If the access is not interrupted, the process returns to step S1351 to keep recording. Here, the state in which "access corresponding to the recorded transfer ID is interrupted" includes two states, namely, "a state in which the current access is switched to access corresponding to a different transfer ID" and "a state in which access is stopped".

In step S1353, the access pattern candidate buffer 1202 records information indicating that access corresponding to the recorded transfer ID is interrupted. In step S1354, the access pattern candidate buffer 1202 resets the down counter and starts to count down.

In step S1355, the access pattern candidate buffer 1202 finishes recording access commands when the count value of the down counter becomes 0. The process then advances to step S1357. If the transfer of a recorded transfer ID is resumed before the count value of the down counter becomes 0 (YES in step S1356), the process returns to the recording of an access command (step S1351).

In step S1357, the access pattern candidate buffer 1202 stops recording an access command and starts generating an access pattern candidate. First of all, the access pattern candidate buffer 1202 determines whether the recorded access commands include repetition of the same access command. If the same access command is repeated, the process advances to step S1358. If no access command is repeated, the process advances to step S1359. In step S1358, the access pattern candidate buffer 1202 extracts repeatedly generated access commands. In step S1359, the access pattern candidate buffer 1202 extracts access commands up to the one generated at the last recorded transfer ID.

In step S1360, the access pattern candidate buffer 1202 determines whether a sequence constituted by the extracted one or more access commands is an access pattern candidate. The access pattern candidate buffer 1202 determines that the sequence cannot be an access pattern candidate, upon determining that refresh executed at the same time as the execution of access cannot be determined when, for example, the access time corresponding to an extracted sequence is short. If the access pattern candidate buffer 1202 determines that the sequence can be an access pattern candidate, the process advances to step S1362. If the access pattern candidate buffer 1202 determines that the sequence cannot be an access pattern candidate, the process advances to step S1361. In step S1361, the access pattern candidate buffer 1202 clears the recorded information upon determining that there is no access pattern candidate, and terminates the processing. In step S1362, the access pattern candidate buffer 1202 determines the extracted sequence as an access pattern candidate, clears the recorded information, and terminates the processing.

FIGS. 14A and 14B are views for explaining the relationship between recorded access commands and access pattern candidates. When the sequence of the access commands shown in FIG. 14A is recorded, no access command is repeatedly generated. Accordingly, the sequence portion obtained by deleting the portion "access is interrupted" recorded last is set as an access pattern candidate. When the sequence of the access commands shown in FIG. 14B is recorded, because the same access command is repeatedly generated, this sequence portion which repeatedly occurs is set as an access pattern candidate.

Figure 15:
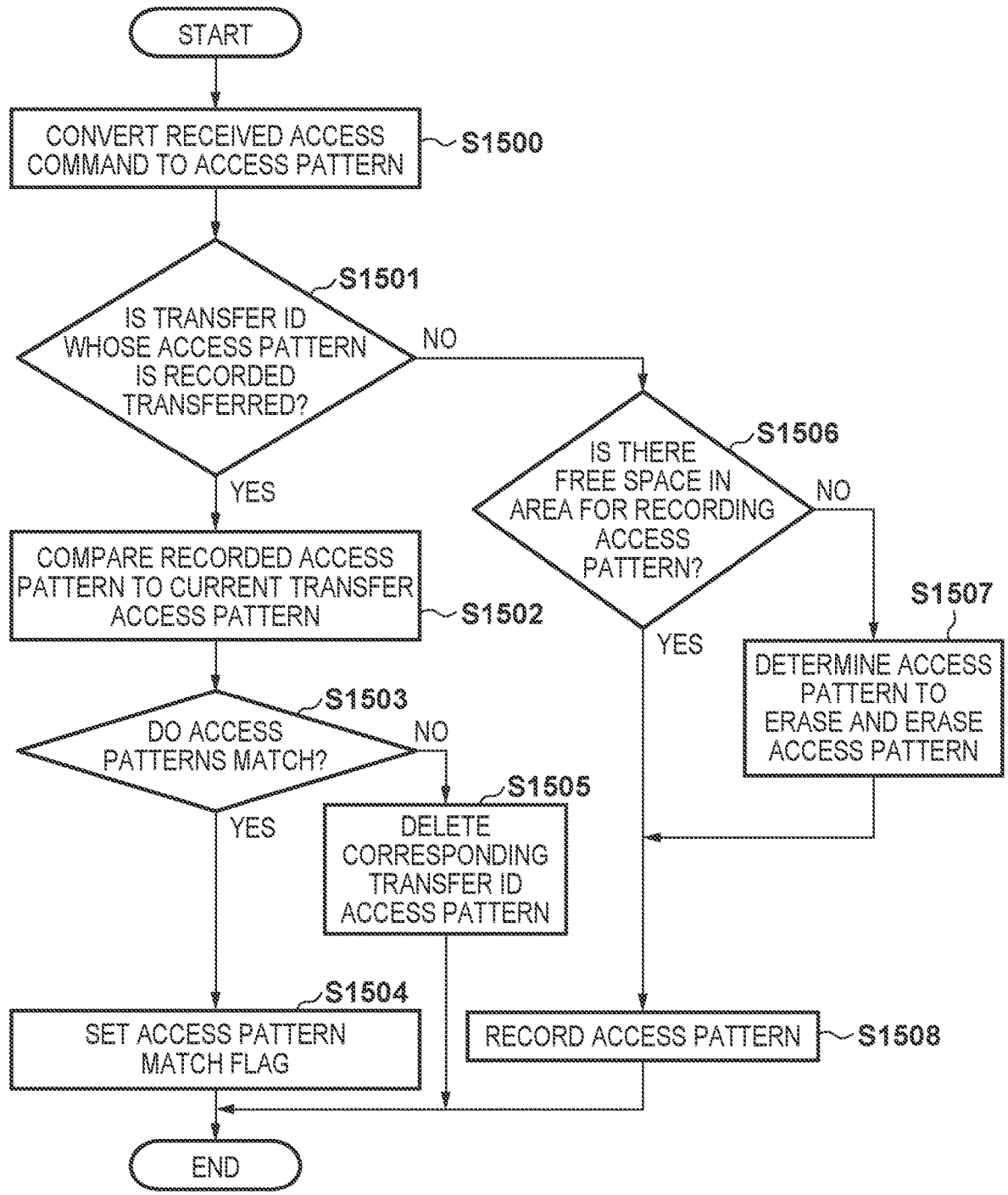
FIG. 15 is a flowchart for processing executed by a recording control unit.

FIG. 15 is a flowchart for processing executed by the recording control unit 1207.

In step S1500, before storing a determined access pattern candidate in the access pattern buffer 1208, the recording control unit 1207 converts the sequence of access commands included in the access pattern candidate into the form of an access pattern. Each access command included in the sequence is recorded in the form of an access command described with reference to FIG. 4. That is, each access command includes a command (information indicating a read or write command), a bank, a transfer length, and a transfer ID. In addition, information indicating "access corresponding to recorded transfer ID is interrupted" is also recorded. The recording control unit 1207 converts the sequence of the access commands included in the access pattern candidate into the form of an access pattern by using these pieces of information. Although described with reference to FIG. 16, an access pattern includes a bank to be accessed, an access time, and the information of the timing of "access is interrupted". The access pattern form described here is merely an example, and another form may be used. For example, in further consideration of address information, it is possible to increase the accuracy of an access pattern.

In step S1501, the recording control unit 1207 checks whether the access pattern corresponding to the transfer ID of the newly generated access pattern candidate has been recorded in the access pattern buffer 1208. If the access pattern has been recorded (the matched transfer ID has been recorded), the process advances to step S1502. If the access pattern has not been recorded, the process advances to step S1506.

In step S1502, the recording control unit 1207 compares the recorded access pattern with the access pattern obtained by conversion in step S1500. In step S1503, the recording control unit 1207 determines whether the two access patterns match each other. If the access patterns match each other, the process advances to step S1504; otherwise, the process advances to step S1505. In step S1504, the recording control unit 1207 sets an access pattern match flag (flag=1), and terminates the processing. In this manner, the access pattern match flag indicates that the recorded access pattern has been generated a plurality of times. In step S1505, the recording control unit 1207 deletes the access pattern corresponding to the transfer ID, and terminates the processing without recording the access pattern obtained by conversion in step S1500.

In step S1506, the recording control unit 1207 checks whether there is a free space in the access pattern buffer. If there is a free space, the process advances to step S1508; otherwise, the process advances to step S1507. In step S1507, the recording control unit 1207 determines a recording area to be erased and erases the data in the recording area. For example, the recording control unit 1207 erases an access pattern in which the access recorded without interruption is relatively short among the recorded access patterns. In step S1508, the recording control unit 1207 records an access pattern in the recording area and terminates the processing. When recording the access pattern, the recording control unit 1207 does not set the access pattern match flag (flag=0).

FIG. 16 is a view for explaining information recorded in the access pattern buffer 1208. As shown in FIG. 16, the information to be stored includes a transfer ID 1600, an access pattern match flag 1602, and an access pattern 1601. As described above, the access pattern 1601 includes the banks to be accessed, the access times, and the information of the timing when "access (based on corresponding transfer ID) is interrupted". When extracting a refresh candidate, only the access pattern corresponding to the transfer ID with the access pattern match flag being set (flag=1) is used.

Note that FIG. 16 shows merely an example, and a pattern match count counter may be used instead of an access pattern match flag. For example, the pattern match count counter is cleared at the time of recording an access pattern, and counts up when an access pattern obtained by conversion matches a recorded access pattern. In this case, it is possible to perform control so as to use an access pattern that has appeared a predetermined number of times for the extraction of a refresh candidate. In addition, when there is no free space in the recording area of the access pattern buffer, it is necessary to erase data upon selecting a recording area having undergone recording. However, it is also possible to perform control so as to select an access pattern corresponding to the small count value of the pattern match counter.

Figure 17:
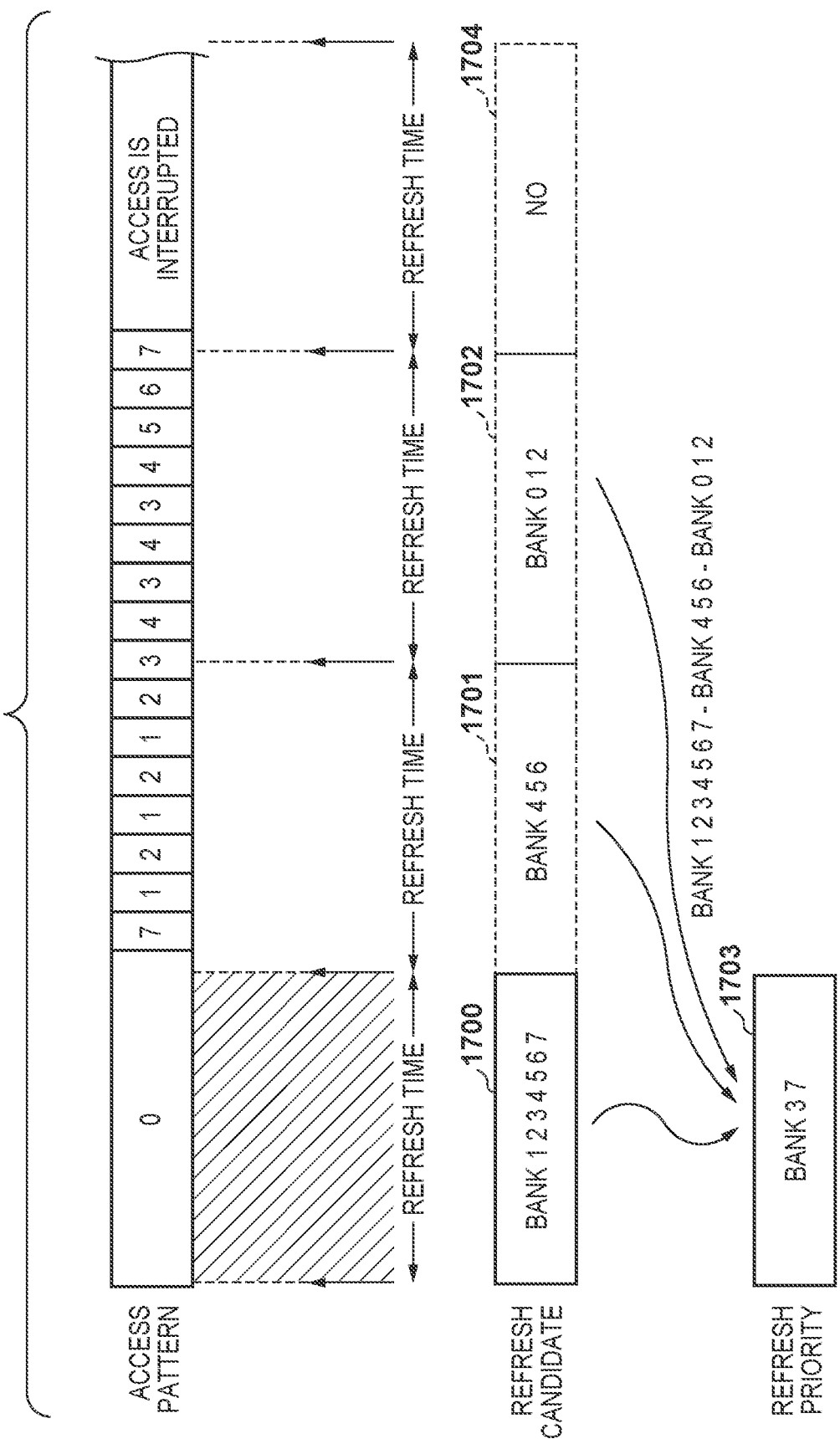
FIG. 17 is a chart for explaining a method of extracting refresh candidates according to the second embodiment.

FIG. 17 is a view for explaining a method of extracting a refresh candidate according to the second embodiment. A recorded access pattern is an access pattern through the period from the start of transfer of the corresponding transfer ID to the end of the transfer. The refresh generating unit 1107 recognizes how far the recorded access pattern has currently proceeded by monitoring the command storage unit 1103. In the second embodiment, an access pattern in a longer period of time can be generated than in the first embodiment, and hence banks to be preferentially refreshed (to be referred to as refresh precedence banks hereinafter) are determined from refresh candidates corresponding to a plurality of refresh commands to be subsequently issued.

The access pattern shown in FIG. 17 indicates an "access pattern appearing hereinafter" that is generated from the access pattern recorded in the access pattern recording area by deleting the portion corresponding to the access that has already been executed.

First of all, a refresh candidate that does not overlap memory access is determined. Here, an access pattern is divided by refresh times to generate refresh candidates in the respective time intervals. Note that when access corresponding to the recorded transfer ID is interrupted, no subsequent refresh candidates are generated. A refresh candidate is repeatedly generated while checking access that occurs in the next refresh time unless access corresponding to the recorded transfer ID is interrupted. Accordingly, referring to FIG. 17, refresh candidates 1700 to 1702 are generated (a refresh candidate 1704 is set to "none").

Subsequently, a refresh precedence bank 1703 is determined from the refresh candidate 1700. These banks are generated by removing banks that possibly can be refreshed at later timings even if refresh is postponed. Among the banks included in the refresh candidate 1700, banks 4, 5, and 6 can be possibly refreshed at the next timing, and banks 0, 1, and 2 can be possibly refreshed at the further next timing. Accordingly, banks 3 and 7 that become refresh candidates only at the first refresh timing are set as refresh precedence banks.

Figure 18:
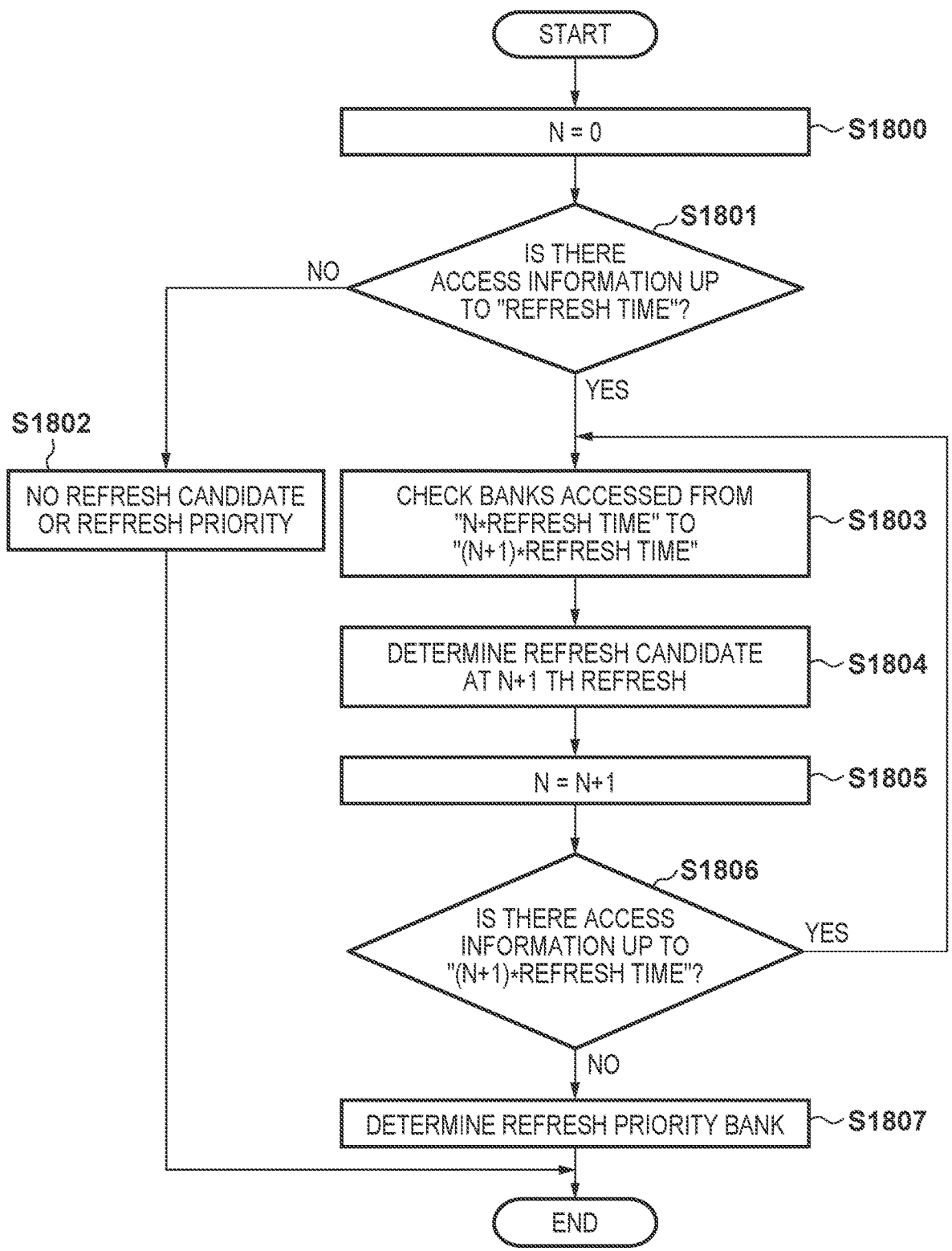
FIG. 18 is a flowchart for refresh extraction according to the second embodiment.

FIG. 18 is a flowchart for refresh extraction according to the second embodiment.

In step S1800, the refresh generating unit 1107 initializes a parameter N (N=0). The parameter N is a parameter for indicating each time interval shown in FIG. 17. The width of each time interval corresponds to a refresh time. In step S1801, the refresh generating unit 1107 checks whether there is access information up to the refresh time. If access information up to the refresh time is not recorded, the process advances to step S1802 when access corresponding to the recorded transfer ID is interrupted before the refresh time (NO in step S1801), the process advances to step S1802. If there is access information through the start of the refresh time, the process advances to step S1803. In step S1802, the refresh generating unit 1107 determines that there is neither refresh candidate nor refresh precedence bank, and terminates the processing.

In step S1803, the refresh generating unit 1107 checks banks to be accessed in (N+1) time intervals (N×refresh time to (N+1)×refresh time). For example, in the case shown in FIG. 17, the refresh generating unit 1107 determines that there is access to bank 0 in the first time interval (from time 0 to the time after the lapse of 1 refresh time) in the first loop (steps S1803 to S1806).

In step S1804, the refresh generating unit 1107 determines banks that are not accessed as refresh candidates in the (N+1)th time interval. For example, in the case shown in FIG. 17, the refresh generating unit 1107 determines seven banks, namely, banks 1 to 7, as refresh candidates in the first time interval in the first loop.

In step S1805, the refresh generating unit 1107 increments (adds by 1) the parameter N. In step S1806, the refresh generating unit 1107 checks whether there is access information in the next time interval. That is, the refresh generating unit 1107 checks whether access is interrupted. If there is access information in the next time interval, the process returns to step S1803 to determine refresh candidates in the next time interval. In this manner, the refresh generating unit 1107 repeatedly determines a refresh candidate while incrementing the parameter N unless the transfer of another ID is interrupted and as long as there is access corresponding to the recorded transfer ID. For example, in the case shown in FIG. 17, in the first and second loops, there is access information in the subsequent time intervals, and hence the process advances to the next loop. In contrast to this, in the third loop, because there is no access information in the subsequent time interval, the process advances to step S1807.

In step S1807, the refresh generating unit 1107 determines refresh precedence banks based on the refresh candidates determined in the respective time intervals and terminates the processing. In the case shown in FIG. 17, the refresh generating unit 1107 determines banks 3 and 7 as refresh precedence banks based on refresh candidates in three time intervals. Note that when a refresh precedence bank is determined from only one refresh candidate, the refresh candidate may be the same as the refresh precedence bank.

As described above, according to the second embodiment, refresh banks are determined from refresh candidates as in the first embodiment. In particular, in the second embodiment, refresh precedence banks are determined based on refresh candidates in the respective time intervals, and a refresh bank is determined from the refresh precedence banks. This arrangement enables more efficient memory access and can suppress a deterioration in memory access performance caused by refresh.

According to the above description, an access pattern set in the access pattern buffer is generated from the access pattern candidates generated by the access pattern candidate generating unit 1200. However, the user may directly set an access pattern in the access pattern buffer by another method, for example, a register access method.

In addition, according to the above description, an access pattern that repeatedly appears is recorded in association with a transfer ID, and a refresh candidate bank is determined so as to prevent a bank subjected to memory access from overlapping a refresh bank. Although when the same access request is issued for each transfer ID, an access pattern is generated, different access requests may be generated for a transfer ID. Such a case can be handled by providing, between the initiator and the DRAM control apparatus, an external logic that converts transfer IDs so as to generate different transfer IDs for each access request.

In addition, access pattern information stored in association with a transfer ID may be added to record two types of access patterns for the same transfer ID. Assume that two types of access request are issued for the same transfer ID. In this case, if access is made first to different addresses, the address of the first access request is recorded. This makes it possible to separately manage two types of access patterns for the same transfer ID.

Furthermore, it is also possible to use the procedure of determining refresh candidates after checking, for a predetermined period, whether transfer has occurred according to a recorded access pattern instead of determining refresh candidates immediately after the start of transfer of the recorded transfer ID. This can prevent a bank subjected to memory access from overlapping a refresh bank when access other than a recorded access pattern occurs.

Third Embodiment

The third embodiment will exemplify still another method of determining refresh candidates. More specifically, described is an embodiment of determining banks to be preferentially refreshed based on the total number of read and write commands for each bank. In addition, described is an embodiment of switching between methods of controlling the issuance order of memory access requests depending on whether bank-designated refresh is being executed.

<Apparatus Arrangement>

Figure 19:
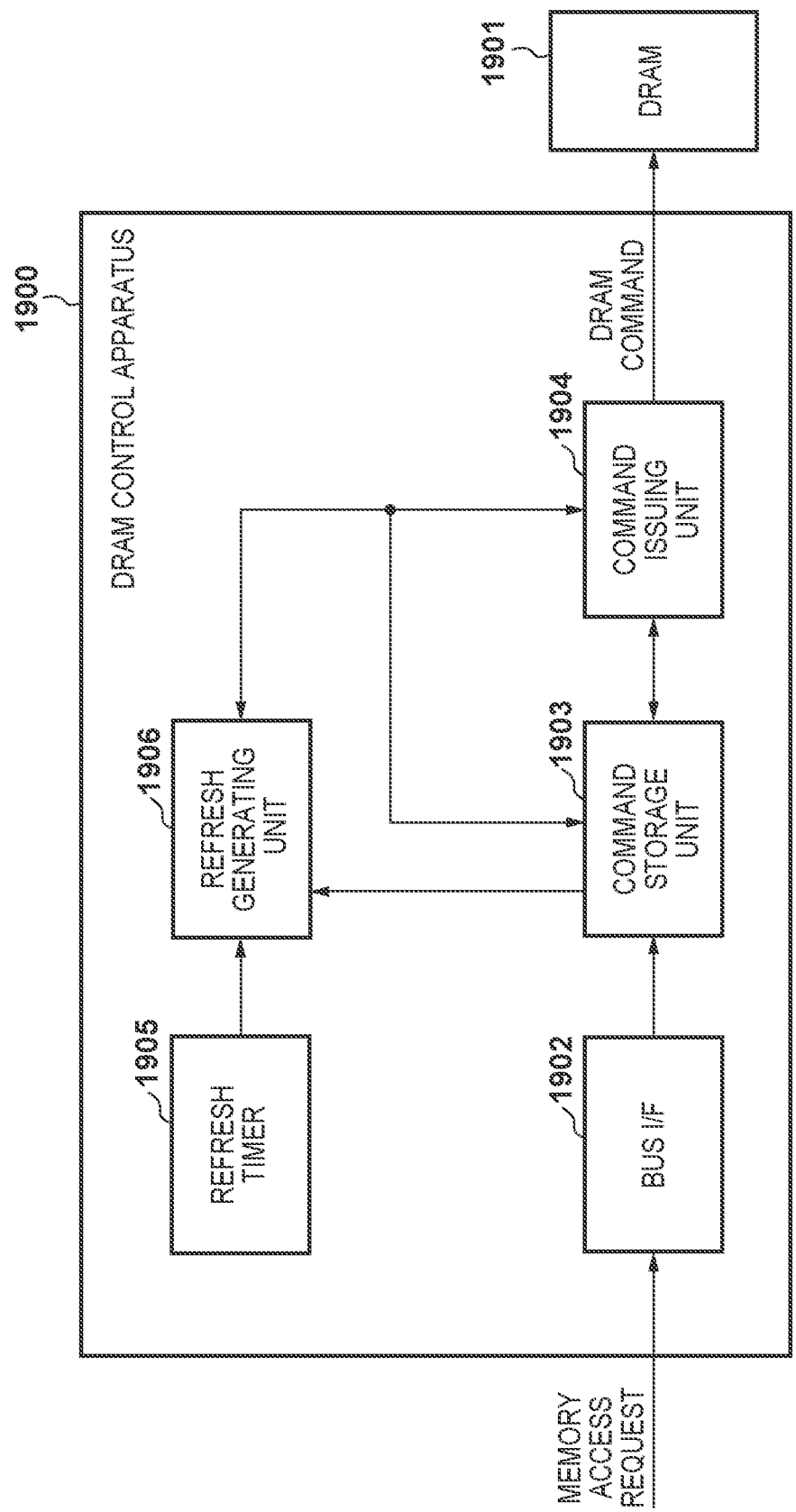
FIG. 19 is a block diagram showing the arrangement of a DRAM control apparatus according to the third embodiment.

FIG. 19 shows the arrangement of a DRAM control apparatus 1900 according to the third embodiment. The DRAM control apparatus 1900 is similar to the DRAM control apparatus 300 according to the first embodiment (FIG. 3) but mainly differs from the DRAM control apparatus 300 in that the DRAM control apparatus 1900 does not have the access pattern generating unit 305, and a refresh generating unit 1906 acquires information from a command storage unit 1903. The command storage unit 1903 is configured to be able to check communication between the refresh generating unit 1906 and a command issuing unit 1904.

The command storage unit 1903 is configured to recognize a bank during refresh by monitoring the refresh request generated by the refresh generating unit 1906 and the refresh response notified by the command issuing unit 1904. The command storage unit 1903 includes a buffer that holds a plurality of access commands generated by a bus I/F 1902. The command storage unit 1903 controls the issuance order of commands in accordance with the state of a DRAM 1901, including the execution state of refresh, and the urgency of memory access request. When an access command is stored in the buffer, the command storage unit 1903 notifies the command issuing unit 1904 of the completion of preparation for an access command, and transmits the access command to the command issuing unit 1904 in accordance with a response from the command issuing unit 1904.

The refresh generating unit 1906 generates a refresh request. More specifically, the refresh generating unit 1906 generates a bank-designated refresh request in accordance with the average refresh period notified by a refresh timer 1905 and the access command stored in the command storage unit 1903.

The command issuing unit 1904 receives an access command for each row address from the command storage unit 1903 and transmits a response. The command issuing unit 1904 generates a DRAM access command for accessing the DRAM 1901 from the received access command for each row address. The refresh generating unit 1906 generates a refresh command for refreshing the DRAM 1901 in accordance with the refresh request for each bank generated by the refresh generating unit 1906. The command issuing unit 1904 issues a DRAM command to the DRAM 301 by adjusting the issuance timings of a DRAM access command and a refresh command. When a refresh command is issued, a refresh response is transmitted to the refresh generating unit 1906.

<Operation of Apparatus>

Figure 20:
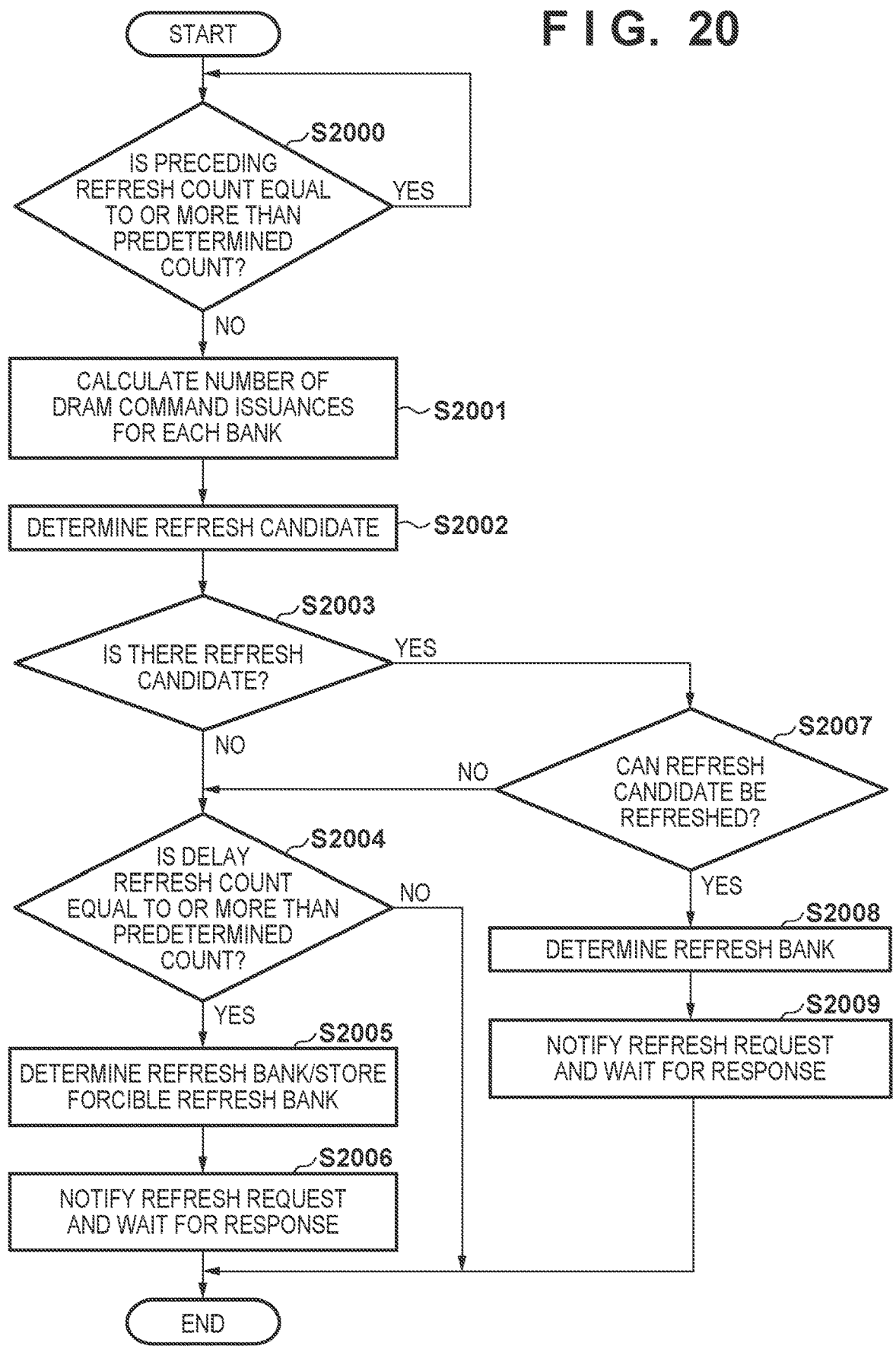
FIG. 20 is a flowchart for refresh request generation according to the third embodiment.

FIG. 20 is a flowchart for refresh request generation according to the third embodiment. This procedure starts when refresh is not currently executed. The refresh generating unit 1906 recognizes, based on the refresh state counter described with reference to FIG. 9, whether the current refresh issuance state is the preceding refresh state or the delayed refresh state.

In step S2000, the refresh generating unit determines whether the preceding refresh count is equal to or more than a predetermined count. If the preceding refresh count is equal to or more than the predetermined count, this determination is repeated. If the preceding refresh count is less than the predetermined count, the process advances to step S2001.

In step S2001, the refresh generating unit calculates the total number of preceding read and write commands of the access commands stored in the command storage unit for each bank from address information and burst lengths. That is, the refresh generating unit calculates an access count to each bank based on access commands (read and write commands).

In step S2002, the refresh generating unit determines a refresh candidate. More specifically, the refresh generating unit determines refresh candidates based on the total number of read and write commands corresponding to banks other than a bank of interest and calculated for each bank.

In step S2003, the refresh generating unit determines whether there is a refresh candidate. If there is a refresh candidate, the process advances to step S2007. If there is no refresh candidate, the process advances to step S2004 because it is necessary to determine whether to wait for the issuance of a refresh command or issue a refresh command.

In step S2004, the refresh generating unit determines whether the delayed refresh count is equal to or more than a predetermined count. This is because the delayed refresh count is specified by the DRAM specification. If the delayed refresh count is equal to or more than the predetermined count, the process advances to step S2005. If the delayed refresh count is less than the predetermined count, there is no need to hasten refresh command issuance, and the refresh generating unit terminates the processing without generating any refresh request.

In step S2005, the refresh generating unit determines a refresh bank and stores the determined bank as a forcible refresh execution bank. Here, if determining a refresh bank, the refresh generating unit checks the refresh management table described with reference to FIG. 8 and selects one bank from banks whose flags are not set (flag=0).

In step S2006, the refresh generating unit generates a refresh request for the refresh bank, and notifies the command issuing unit of the refresh request. The refresh generating unit then waits for a response and terminates the processing.

In step S2007, the refresh generating unit determines whether a refresh candidate can be refreshed. The refresh generating unit performs this determination based on whether the refresh candidate is a bank whose flag is not set (flag=0), upon checking the refresh management table described with reference to FIG. 8. If the bank can be refreshed, the process advances to step S2008; otherwise, the process advances to step S2004 to determine whether it is necessary to issue a delayed refresh command.

In step S2008, the refresh generating unit determines a refresh bank. Note that the refresh generating unit may preferentially determine a bank to which a forcible refresh command has been issued in the delayed refresh state. This is because preferentially refreshing the bank to which the refresh generating unit issued a forcible refresh command in the past will prevent issuing a forcible refresh command to the same bank again and suppress refresh from influencing memory access to a specific bank.

In step S2009, the refresh generating unit generates a refresh request for the refresh bank, and notifies the command issuing unit of the refresh request. The refresh generating unit then waits for a response and terminates the processing.

Figures 21, 22:
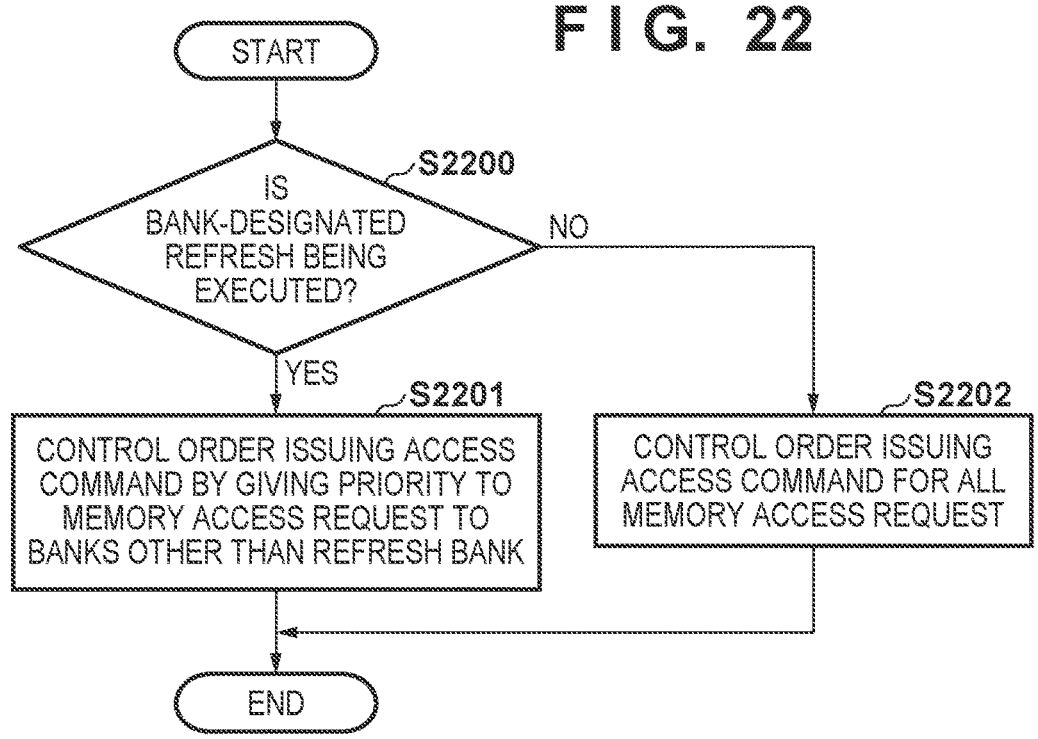
FIG. 21 is a view for explaining a method of determining refresh candidates according to the third embodiment.
FIG. 22 is a flowchart for access command issuing order control according to the third embodiment.

FIG. 21 is a view for explaining a method of determining refresh candidates according to the third embodiment.

The refresh generating unit calculates a total number 2101 of read and write commands for each bank from the address information and burst length information of an access command stored in the command storage unit. Likewise, the refresh generating unit calculates a total number 2102 of read and write commands for each of the remaining banks. In the case shown in FIG. 21, the total number of read and write commands to access the banks other than bank 0 (that is, bank 1 to bank 7) is "54". Finally, the refresh generating unit determines a priority level 2103 of refresh.

Assume that while a given bank is refreshed, the number of read and write commands that can be concurrently issued to the remaining banks is set to "50". In this case, when a bank corresponding to more than 50 as the total number of read and write commands to the remaining banks is refreshed, it is possible to incessantly issue read and write commands to the remaining banks concurrently with refresh. That is, it is possible to suppress a deterioration in memory access performance caused by refresh. Accordingly, a refresh candidate is a bank corresponding to more than 50 as the total number of read and write commands to the remaining banks.

If there are a plurality of refresh candidates (banks each corresponding to more than 50 as the total number of read and write commands to the remaining banks), a higher priority level is assigned to a bank corresponding to a larger number of read and write commands to the remaining banks. In the case shown in FIG. 21, among the refresh candidates, the highest priority level is assigned to "bank 2" corresponding to the largest total number of read and write commands to the remaining banks. The lowest priority level is assigned to "bank 3" corresponding to the smallest total number of read and write commands to the remaining banks among the refresh candidates. Banks 1, 4, and 7 are not refresh candidates because all the read and write commands that can be issued during refresh are issued, and no read and write commands can be issued until the completion of the refresh.

When the buffer of the command storage unit becomes empty, no memory access occurs. Accordingly, there is no need to consider a deterioration in memory access performance caused by refresh, and hence all the banks are set as refresh candidates.

FIG. 22 is a flowchart for controlling the issuance order of access commands according to the third embodiment. Some DRAM control apparatus includes a function of interchanging the order of received memory access requests. This function is used to improve the efficiency of DRAM access or implement a memory access request in accordance with the urgency. According to the third embodiment, methods of controlling the issuance order of memory access requests are switched depending on whether bank-designated refresh is executed. This procedure starts when the command issuing unit is notified of the storage of an access command and the state of the DRAM is changed by the issuance of a DRAM command.

In step S2200, the command storage unit monitors a refresh request and a response from the refresh generating unit and the command issuing unit to recognize whether bank-designated refresh is being executed. If bank-designated refresh is being executed, the process advances to step S2201; otherwise, the process advances to step S2202.

In step S2201, the command storage unit controls the issuance order of access commands with respect to the command issuing unit so as to give priority to memory access to banks other than a refresh bank. That is, the command storage unit performs control so as not to output any memory access request to a refresh bank. In step S2202, the command storage unit controls the issuance order of access commands with respect to the command issuing unit so as to handle all memory access requests as target requests.

The issuance order of access commands is controlled so as to give priority to memory access requests that cause no deterioration in memory access performance. However, priority may be given to memory access request with high urgency.

According to the third embodiment described above, a bank that has no influence on memory access is selected, and bank-designated refresh is performed. The order of memory access requests is interchanged in accordance with the refresh execution state. This arrangement enables more efficient memory access and can suppress a deterioration in memory access performance caused by refresh.

Other Embodiments

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2019-171855, filed Sep. 20, 2019, which is hereby incorporated by reference herein in its entirety.

What is claimed is:

1. A memory control apparatus that controls access to a DRAM constituted by a plurality of banks, the apparatus comprising:
   a generating unit configured to generate an access pattern indicating an access order and an access time for each bank of the DRAM;
   a first issuing unit configured to issue an access command in accordance with an access request for the DRAM; and
   a second issuing unit configured to issue a refresh command for a first bank of the DRAM based on an access time of an access command for a second bank, which is different from the first bank,
   wherein the second issuing unit determines, from among the plurality of banks, a bank candidate for which the refresh command is issued, based on the access pattern and a refresh time required for refresh.

2. The apparatus according to claim 1, wherein the second issuing unit determines, as the bank candidate, from among the plurality of banks, a bank to which no access occurs in a time interval corresponding to the refresh time in the access pattern.

3. The apparatus according to claim 1, further comprising:
   a storage unit configured to store not less than one access pattern generated by the generating unit,
   wherein in a state where an access pattern newly generated by the generating unit coincides with any of access patterns stored in advance in the storage unit, the second issuing unit determines the bank candidate in each of a plurality of time intervals each corresponding to the refresh time, and determines, from among the plurality of banks, a bank for which the refresh command is preferentially issued in a first time interval of the plurality of time intervals based on the bank candidate determined in each of the plurality of time intervals.

4. The apparatus according to claim 1, wherein the second issuing unit:
   calculates an access count to each bank of the DRAM based on the access command,
   calculates the total number of access counts to each bank other than a bank of interest, and
   determines, from among the plurality of banks, a bank corresponding to the total number exceeding a predetermined count as the bank candidate.

5. The apparatus according to claim 4, wherein in a state where the bank candidate is more than one, the second issuing unit sets high priority in terms of issuing a refresh command for the bank candidate for which the total number is largest.

6. The apparatus according to claim 4, wherein the predetermined count is the number of commands issuable to other banks concurrently with execution of refresh.

7. The apparatus according to claim 4, wherein the buffer is configured to:
   check, from among the plurality of banks, a bank that is currently refreshed in the DRAM, and
   not output an access command to a bank currently refreshed among access commands stored in the buffer.

8. The apparatus according to claim 7, wherein the buffer checks, from among the plurality of banks, a bank currently refreshed in the DRAM by checking the second issuing unit.

9. The apparatus according to claim 4, wherein the second issuing unit sets all banks as bank candidates for which the refresh command is issued, in a state where no access command is stored in the buffer.

10. A method of controlling a memory control apparatus that controls access to a DRAM constituted by a plurality of banks, the method comprising:
    generating an access pattern indicating an access order and an access time for each bank of the DRAM;
    issuing an access command in accordance with an access request for the DRAM; and
    issuing a refresh command for a first bank of the DRAM based on an access time of an access command for a second bank, which is different from the first bank,
    wherein the issuing of the refresh command determines, from among the plurality of banks, a bank candidate for which the refresh command is issued, based on the access pattern and a refresh time required for refresh.

* * * * *